US008722310B2

(12) United States Patent
Suzuki

(10) Patent No.: US 8,722,310 B2
(45) Date of Patent: May 13, 2014

(54) LITHOGRAPHIC PRINTING PLATE PRECURSOR AND METHOD OF PREPARING LITHOGRAPHIC PRINTING PLATE USING THE SAME

(75) Inventor: Shota Suzuki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/562,956

(22) Filed: Jul. 31, 2012

(65) Prior Publication Data

US 2013/0052586 A1 Feb. 28, 2013

(30) Foreign Application Priority Data

Aug. 31, 2011 (JP) .................................. 2011-190183

(51) Int. Cl.
*B41M 5/00* (2006.01)
*B41N 1/00* (2006.01)
*G03F 7/00* (2006.01)
*G03F 7/26* (2006.01)

(52) U.S. Cl.
USPC ................. 430/271.1; 430/270.1; 430/281.1; 430/302; 430/309; 101/453; 101/463.1

(58) Field of Classification Search
USPC ......... 430/270.1, 271.1, 283.1, 302; 101/453, 101/463.1
See application file for complete search history.

(56) References Cited

U.S. PATENT DOCUMENTS

| | | | |
|---|---|---|---|
| 2,850,445 A | 9/1958 | Oster | |
| 3,418,118 A | 12/1968 | Thommes et al. | |
| 3,479,185 A | 11/1969 | Chambers | |
| 3,495,987 A | 2/1970 | Moore | |
| 4,427,760 A * | 1/1984 | Nagazawa et al. | 430/287.1 |
| 4,708,925 A | 11/1987 | Newman | |
| 6,132,935 A | 10/2000 | Kobayashi et al. | |
| 2005/0069811 A1 | 3/2005 | Mitsumoto et al. | |
| 2008/0035000 A1 * | 2/2008 | Miyamoto et al. | 101/457 |
| 2009/0075206 A1 | 3/2009 | Kanchiku et al. | |
| 2009/0246692 A1 * | 10/2009 | Sasaki | 430/283.1 |
| 2012/0052442 A1 * | 3/2012 | Suzuki et al. | 430/271.1 |
| 2012/0216693 A1 * | 8/2012 | Oohashi | 101/463.1 |
| 2012/0219911 A1 * | 8/2012 | Suzuki et al. | 430/283.1 |

FOREIGN PATENT DOCUMENTS

| | | | |
|---|---|---|---|
| EP | 1739486 A1 | | 1/2007 |
| EP | 2354851 A2 | | 8/2011 |
| EP | 2423748 A1 | | 2/2012 |
| EP | 2492751 A1 | | 8/2012 |
| JP | 44-20189 B | | 8/1969 |
| JP | 8-276558 A | | 10/1996 |
| JP | 2004322575 | * | 11/2004 |
| JP | 2005-119273 A | | 5/2005 |
| JP | 2007-114221 A | | 5/2007 |
| JP | 2007114221 A | * | 5/2007 |
| JP | 2008-162056 A | | 7/2008 |
| JP | 4162365 B2 | | 10/2008 |
| JP | 2009-091555 A | | 4/2009 |
| WO | WO 2011/118457 A1 | | 9/2011 |

OTHER PUBLICATIONS

Japanese Office Action dated Jul. 23, 2013 for Japanese Application No. 2011-190183 with partial English translation.

* cited by examiner

*Primary Examiner* — Chanceity Robinson
(74) *Attorney, Agent, or Firm* — Birch, Stewart, Kolasch & Birch, LLP

(57) ABSTRACT

A lithographic printing plate precursor includes, in the following order: a support; an image-recording layer which is capable of forming an image by removing an unexposed area by an automatic development processor in the presence of a developer having pH of from 2 to 14 after exposure and contains (A) a sensitizing dye, (B) a polymerization initiator, (C) a polymerizable compound and (D) a polymer which is insoluble in water and alkali-soluble; and a protective layer, and the protective layer contains (E) a hydrophilic polymer which has a repeating unit represented by the formula (1) as defined herein and a repeating unit represented by the formula (2) as defined herein and a sum of the repeating unit represented by the formula (1) and the repeating unit represented by the formula (2) is at least 95% by mole based on total repeating units constituting the polymer.

9 Claims, No Drawings

LITHOGRAPHIC PRINTING PLATE PRECURSOR AND METHOD OF PREPARING LITHOGRAPHIC PRINTING PLATE USING THE SAME

FIELD OF THE INVENTION

The present invention relates to a lithographic printing plate precursor and a method of preparing a lithographic printing plate using the same. More particularly, it relates to a lithographic printing plate precursor capable of undergoing direct plate making by image exposure with laser and capable of undergoing development with a developer having pH from 2 to 14 and a method of preparing a lithographic printing plate using the same.

BACKGROUND OF THE INVENTION

A solid laser, semiconductor laser and gas laser having a large output and a small size, which radiate an ultraviolet ray, visible light or infrared ray having a wavelength from 300 to 1,200 nm, have become easily available, and these lasers are very useful for recording light sources used in the direct plate making based on digital data, for example, from a computer. Various investigations on recording materials sensitive to such various laser beams have been made. Typical examples thereof include firstly recording materials capable of being recorded with an infrared laser having an image-recording wavelength of 760 nm or longer, for example, a positive type recording material described in U.S. Pat. No. 4,708,925, an acid catalyst crosslinking type negative type recording material described in JP-A-8-276558 (the term "JP-A" as used herein means an "unexamined published Japanese patent application") and a radical polymerization type negative type recording material containing an infrared absorbing agent described in JP-A-2009-91555. Secondly, as recording materials responsive to an ultraviolet ray or visible light laser having a wavelength from 300 to 700 nm, many radical polymerization type negative type recording materials, for example, those described in U.S. Pat. No. 2,850,445 and JP-B-44-20189 (the term "JP-B" as used herein means an "examined Japanese patent publication") are known.

Further, with respect to hitherto known lithographic printing plate precursors (hereinafter, also referred to as PS plates), after image exposure a process of removing the non-image area by dissolution (development processing) is indispensable and a post-processing process, for example, washing the printing plate after the development processing with water, treatment of the printing plate after the development processing with a rinse solution containing a surfactant or treatment of the printing plate after the development processing with an oil-desensitizing solution containing gum arabic or a starch derivative, is also necessary. The point that such additional wet treatments are indispensable is a large subject of investigation in hitherto known PS plates. Even when the first half (image-forming processing) of plate making process is simplified by the above-described digital processing, the effects due to the simplification is still insufficient as long as the last half (development processing) is the troublesome wet treatment.

Particularly, the consideration for global environment has become a great concern throughout the field of industry in recent years. In view of the consideration for global environment, a treatment with a developer closer to a neutral range and a small amount of waste liquid are subjects of further investigations. In addition, it is desirable that the wet type post-processing is simplified or changed to a dry type processing.

From this viewpoint, as one method for simplifying the processing process, a method of one bath processing wherein development and a gum solution treatment are simultaneously conducted is known. Specifically, the method is a simple development process which does not require a post-water washing process and in which after image exposure, a lithographic printing plate precursor is subjected without undergoing a pre-water washing process to removal of a protective layer, removal of a non-image area and a gum solution treatment simultaneously with one bath and then drying without undergoing a post-water washing process to perform a printing process.

As another method of omitting the processing process, a method referred to as on-press development wherein an exposed lithographic printing plate precursor is mounted on a cylinder of a printing machine and the non-image area of the lithographic printing plate precursor is removed by supplying dampening water and ink while rotating the cylinder is known. Specifically, according to the method, the lithographic printing plate precursor is exposed imagewise and then mounted on a printing machine as it is to complete development processing in a conventional process of printing.

In any lithographic printing plate precursor of conventional development process, simple development process and on-press development process, the common problem of lithographic printing plate precursor having a hydrophilic protective layer is deterioration of ink receptivity. It is believed that this is caused by a hydrophilic component in the protective layer which gets into the image-recording layer and the image-recording layer is cured as it is by exposure to from the image area. This problem is particularly notable in the case where hydrophobicity of the image-recording layer is not sufficient.

It is proposed to incorporate a cellulose into a protective layer in order to impart ink receptivity in Japanese Patent 4162365 or JP-A-2008-162056. However, the technique is insufficient in view of balance between the ink receptivity or printing durability and the development property.

Further, a lithographic printing plate precursor having provided on a support, an image-recording layer capable of being removed with either printing ink, dampening water or both of them containing an actinic radiation absorber, a polymerization initiator and a polymerizable compound and a protective layer containing an inorganic stratiform compound in this order is described in JP-A-2005-119273. However, the technique has a problem in that the inorganic stratiform compound having a hydrophilic surface and a polyvinyl alcohol resin which is used as a binder get into the image-recording layer during the coating and drying stages and the image-recording layer is cured as it is by exposure to from the image area so that the ink receptivity just after the preparation and after the preservation of lithographic printing plate precursor is deteriorated.

SUMMARY OF THE INVENTION

Therefore, an object of the present invention is to provide a lithographic printing plate precursor which overcomes the problems in the prior art described above. Specifically, it is to provide a lithographic printing plate precursor which provides a lithographic printing plate having good ink receptivity and high printing durability according to a conventional development process and a simple development process and a method of preparing a lithographic printing plate using the same. In particular, it is to provide a lithographic printing plate precursor providing excellent ink receptivity and high printing durability when the lithographic printing plate precursor is exposed and developed after preservation and special color ink is used in printing and a method of preparing a lithographic printing plate using the same.

(1) A lithographic printing plate precursor comprising, in the following order: a support; an image-recording layer which is capable of forming an image by removing an unexposed area by an automatic development processor in the presence of a developer having pH of from 2 to 14 after exposure and contains (A) a sensitizing dye, (B) a polymerization initiator, (C) a polymerizable compound and (D) a polymer which is insoluble in water and alkali-soluble; and a protective layer, wherein the protective layer contains (E) a hydrophilic polymer which contains a repeating unit represented by formula (1) shown below and a repeating unit represented by formula (2) shown below and the sum of these two repeating units is at least 95% by mole based on the total repeating units constituting the polymer.

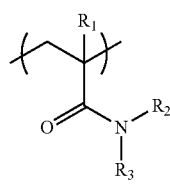

Formula (1)

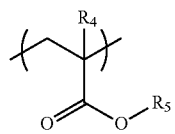

Formula (2)

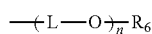

Formula (3)

In formulae (1) and (2), $R_1$ and $R_4$ each independently represents a hydrogen atom or a methyl group, $R_2$ and $R_3$, which may be the same or different, each represents a hydrogen atom, a methyl group or an ethyl group, and $R_5$ represents an alkyl group having from 2 to 10 carbon atoms or a substituent represented by formula (3) shown above, and in formula (3), L represents an alkylene group having from 2 to 6 carbon atoms, $R_6$ represents an alkyl group having from 4 to 8 carbon atoms, and n means an average addition molar number of polyether and represents a number of from 2 to 4.

(2) The lithographic printing plate precursor as described in (1) above, wherein the polymer (E) containing a repeating unit represented by formula (1) and a repeating unit represented by formula (2) further contains a repeating unit represented by formula (4) shown below in an amount of from 0.3 to 5.0% by mole based on the total repeating units constituting the polymer.

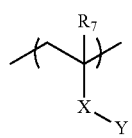

Formula (4)

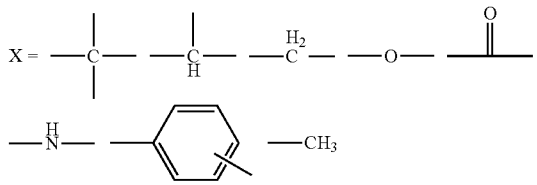

Structural Group (5)

In formula (4), $R^7$ represents a hydrogen atom or a methyl group, X represents a single bond, a divalent connecting chain selected from structures of Structural Group (5) or a divalent connecting chain formed by a combination of two or more structures of Structural Group (5), and Y represents at least any substituent selected from a carboxylic acid group, a carboxylate group, a sulfonic acid group, a sulfonate group, a phosphoric acid group, a phosphate group, a phosphonic acid group, a phosphonate group, a hydroxy group, a carbobetaine group, a sulfobetaine group and an ammonium group.

(3) The lithographic printing plate precursor as described in (2) above, wherein Y is at least any substituent selected from a sulfonic acid group, a sulfonate group, a carbobetaine group, a sulfobetaine group and an ammonium group.

(4) The lithographic printing plate precursor as described in any one of (1) to (3) above, wherein $R_2$ and $R_3$ in the repeating unit represented by formula (1) are both hydrogen atoms and $R_5$ in the repeating unit represented by formula (2) is an unsubstituted straight-chain, branched or cyclic alkyl group having from 2 to 8 carbon atoms.

(5) The lithographic printing plate precursor as described in any one of (1) to (4) above, wherein the protective layer contains (F) an inorganic stratiform compound.

(6) The lithographic printing plate precursor as described in any one of (1) to (5) above, wherein the sensitizing dye (A) is an infrared absorbing dye.

(7) A method of preparing a lithographic printing plate comprising exposing imagewise the lithographic printing plate precursor as described in any one of (1) to (6) above and then removing an unexposed area of the image-recording layer by an automatic development processor in the presence of a developer having pH of from 2 to 14.

According to the present invention, the object of providing a lithographic printing plate precursor providing good ink receptivity and high printing durability can be achieved by incorporating (E) the hydrophilic polymer containing repeating units having the specific structures into the protective layer. In particular, in case of using special color ink the ink receptivity is unexpectedly not deteriorated even after preservation of the lithographic printing plate precursor.

The functional mechanism of the invention is not quite clear but it is estimated as follows.

Heretofore, a problem arises in that a hydrophilic polymer and/or (F) the inorganic stratiform compound in a protective layer undergo interlayer mixing with the component of the image-recording layer at the time of drying of the protective layer and remain in the image area after development to cause deterioration of the ink receptivity.

In case of using a conventional hydrophilic binder polymer which ensures water solubility by including an acid group or a salt thereof in its molecule, since hydrophilicity of the image-recording layer and protective layer is high and the image-recording layer and protective layer are easy to be mixed, it is difficult to increase the ink receptivity. In particular, as for a lithographic printing plate precursor having a protective layer containing the inorganic stratiform compound, increase in the ink receptivity is more difficult.

On the contrary, when (E) the hydrophilic polymer containing repeating units having the specific structures is used in the protective layer, the ink receptivity is good.

It is estimated that this is because (E) the hydrophilic polymer according to the invention inhibits mixing the component of the protective layer with the component of the image-recording layer even in the case where the protective layer contains (F) the inorganic stratiform compound so that the component of the protective layer can be rapidly removed at the development.

According to the invention, when the hydrophilic component having the specific structure represented by formula (4) is introduced, it is extremely important that the amount of the hydrophilic component introduced is small. When the amount of the hydrophilic component introduced is too large or too small, ink receptivity of special color ink is deteriorated. The functional mechanism of the improvement in ink receptivity is not quite clear but it is estimated that the introduction of a small amount of the component having an extremely high hydrophilicity improves balance between development property and ink receptivity so that the deterioration of ink receptivity in case of using the special color ink which is liable to occur as to a lithographic printing plate precursor after preservation is unexpectedly hardly occur.

As described above, the present invention is a technique relating to a novel polymer for protective layer of a lithographic printing plate precursor which is not expected from the prior art and makes the remarkable improvement in practical performance possible.

According to the present invention, a lithographic printing plate precursor providing good ink receptivity (particularly, ink receptivity of special color ink) and high printing durability and a method of preparing a lithographic printing plate using the same can be provided.

DETAILED DESCRIPTION OF THE INVENTION

The present invention will be described in detail below.
[Lithographic Printing Plate Precursor]

The lithographic printing plate precursor according to the invention comprises, in the following order: a support; an image-recording layer which is capable of forming an image by removing an unexposed area with a developer having pH of from 2 to 14; and a protective layer. It should be noted that the phrase "in the following order" does not exclude an embodiment wherein any other layer(s) is provided between the support and the image-recording layer or between the image-recording layer and the protective layer.

The lithographic printing plate precursor according to the invention may have an undercoat layer between the support and the image-recording layer.

Hereinafter, the constituting elements, components and the likes of the lithographic printing plate precursor according to the invention will be described.
(Protective Layer)

The protective layer according to the invention is characterized by containing a hydrophilic polymer which contains a repeating unit represented by formula (1) shown below and a repeating unit represented by formula (2) shown below and the sum of these two repeating units is at least 95% by mole based on the total repeating units constituting the polymer.

In the range of the sum of two repeating units described above, compatibility between the ink receptivity and the development property is possible. When the sum of two repeating units is less than 95% by mole, the ink receptivity of special color ink is liable to deteriorate.

Hereinafter, the hydrophilic polymer is also referred to as a hydrophilic polymer according to the invention. The hydrophilic polymer according to the invention containing the repeating unit represented by formula (1) shown below and the repeating unit represented by formula (2) shown below preferably further contains a repeating unit represented by formula (4) shown below in an amount of from 0.3 to 5.0% by mole based on the total repeating units constituting the polymer.

Formula (1)

Formula (2)

Formula (3)

In formulae (1) and (2), $R_1$ and $R_4$ each independently represents a hydrogen atom or a methyl group, $R_2$ and $R_3$, which may be the same or different, each represents a hydrogen atom, a methyl group or an ethyl group, and $R_5$ represents an alkyl group having from 2 to 10 carbon atoms or a substituent represented by formula (3) shown above, and in formula (3), L represents an alkylene group having from 2 to 6 carbon atoms, $R_6$ represents an alkyl group having from 4 to 8 carbon atoms, and n means an average addition molar number of polyether and represents a number of from 2 to 4.

Formula (4)

Structural Group (5)

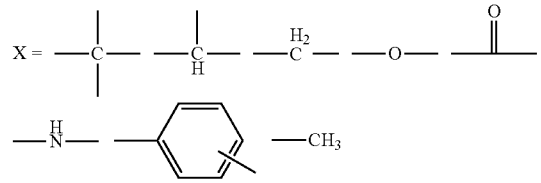

In formula (4), $R^7$ represents a hydrogen atom or a methyl group, X represents a single bond, a divalent connecting chain selected from structures of Structural Group (5) or a divalent connecting chain formed by a combination of two or more structures of Structural Group (5), and Y represents at least any substituent selected from a carboxylic acid group, a carboxylate group, a sulfonic acid group, a sulfonate group, a phosphoric acid group, a phosphate group, a phosphonic acid group, a phosphonate group, a hydroxy group, a carbobetaine group, a sulfobetaine group and an ammonium group.

In the repeating unit represented by formula (1), $R_2$ and $R_3$ each preferably represents a hydrogen atom. In the repeating unit represented by formula (2), $R_5$ preferably represents an unsubstituted straight-chain, branched or cyclic alkyl group having from 2 to 8 carbon atoms.

Of the combinations of the repeating units represented by formulae (1) and (2) respectively, a combination where $R_1$ and $R_4$ in formulae (1) and (2) are both hydrogen atoms, $R_2$ and $R_3$ in formula (1) are both hydrogen atoms, and $R_5$ in formula (2) is an unsubstituted branched alkyl group having from 3 to 4 carbon atoms is most preferred.

In the repeating unit represented by formula (4), from the standpoint of water solubility and development property, Y is preferably a sulfonic acid group, a sulfonate group, a carbobetaine group, a sulfobetaine group or an ammonium group, and more preferably a sulfonic acid group, a sulfonate group or a sulfobetaine group.

Specific examples of a monomer from which the repeating unit represented by formula (1) is derived include acrylamide, methacrylamide, N-methylacrylamide, N-methylmethacrylamide, N-ethylacrylamide, N-ethylmethacrylamide, N,N-dimethylacrylamide, N,N-dimethylmethacrylamide, N,N-diethylacrylamide, N,N-diethylmethacrylamide, N,N-ethylmethylacrylamide and N,N-ethylmethylmethacrylamide.

Specific examples of a monomer from which the repeating unit represented by formula (2) is derived include ethyl acrylate, propyl acrylate, isopropyl acrylate, n-butyl acrylate, isobutyl acrylate, tert-butyl acrylate, pentyl acrylate, hexyl acrylate, cyclohexyl acrylate, heptyl acrylate, octyl acrylate, 2-ethylhexyl acrylate, nonyl acrylate, decyl acrylate, 2-(2-ethylhexyloxyethoxy)ethyl acrylate, ethyl methacrylate, propyl methacrylate, isopropyl methacrylate, n-butyl methacrylate, isobutyl methacrylate, tert-butyl methacrylate, pentyl methacrylate, hexyl methacrylate, cyclohexyl methacrylate, heptyl methacrylate, octyl methacrylate, 2-ethylhexyl methacrylate, nonyl methacrylate and decyl methacrylate.

Specific examples of a monomer from which the repeating unit represented by formula (4) is derived include 2-acryloylamino-2-methylpropanesulfonic acid, sodium 2-acryloylamino-2-methylpropanesulfonate, potassium 2-acryloylamino-2-methylpropanesulfonate, 4-((3-methacrylamidopropyl)dimethylammonio)butane-1-sulfonate, 4-((3-acrylamidopropyl)dimethylammonio) butane-1-sulfonate, vinyl alcohol, acrylic acid, methacrylic acid, sodium styrenesulfonate, diethylene glycol 2-ethylhexyl methacrylate, hydroxyethyl acrylate, hydroxyethyl methacrylate, methacrylcholine chloride, potassium 3-sulfopropyl methacrylate, 2-(methacryloyloxy)ethyl phosphate and dimethyl-N-methacryloyloxyethyl-N-carboxymethyl-ammonium betaine.

In the case where the hydrophilic polymer (E) according to the invention contains the repeating unit represented by formula (4), the content thereof is from 0.3 to 5% by mole. The content is preferably from 0.3 to 3% by mole, and more preferably from 0.3 to 1.5% by mole. In the range described above, good development property, ink receptivity and printing durability are obtained. When the content is less than 0.3% by mole or exceeds 5% by mole, the ink receptivity, particularly, the ink receptivity of special color ink deteriorates.

The content of the repeating unit represented by formula (1) is preferably from 65 to 96.7% by mole, more preferably from 70 to 80% by mole, particularly preferably from 74 to 80% by mole, based on the total repeating units constituting the polymer. The content of the repeating unit represented by formula (2) is preferably from 3 to 30% by mole, more preferably from 20 to 30% by mole, particularly preferably from 20 to 26% by mole, based on the total repeating units constituting the polymer.

The weight average molecular weight (Mw) of the hydrophilic polymer (E) is preferably from 10,000 to 200,000, more preferably from 10,000 to 100,000, and most preferably from 10,000 to 30,000.

Specific examples of the hydrophilic polymer according to the invention are set forth below, but the invention should not be construed as being limited thereto.

TABLE 1

Hydrophilic Polymers 1 to 45
(The numbers in the table indicate numbers of the hydrophilic polymers)
Composition Ratio of Formula (1)/Formula (2) = 80/20 (% by mole), Mw = 30,000

| Formula (2) | Formula (1) | | | | |
|---|---|---|---|---|---|
| | –NH₂ (acrylamide) | –NH₂ (methacrylamide) | N-methyl | N-H methyl | N-H ethyl |
| ethyl acrylate | 1 | 10 | 19 | 28 | 37 |
| propyl acrylate | 2 | 11 | 20 | 29 | 38 |
| butyl acrylate | 3 | 12 | 21 | 30 | 39 |

TABLE 1-continued

Hydrophilic Polymers 1 to 45
(The numbers in the table indicate numbers of the hydrophilic polymers)
Composition Ratio of Formula (1)/Formula (2) = 80/20 (% by mole), Mw = 30,000

| Formula (2) | Formula (1) —C(=O)NH$_2$ | Formula (1) —C(=O)NH$_2$ | Formula (1) —C(=O)N(CH$_3$)$_2$ | Formula (1) —C(=O)NHCH$_3$ | Formula (1) —C(=O)NHC$_2$H$_5$ |
|---|---|---|---|---|---|
| isobutyl ester | 4 | 13 | 22 | 31 | 40 |
| tert-butyl ester | 5 | 14 | 23 | 32 | 41 |
| hexyl ester | 6 | 15 | 24 | 33 | 42 |
| cyclohexyl ester | 7 | 16 | 25 | 34 | 43 |
| octyl ester | 8 | 17 | 26 | 35 | 44 |
| 2-ethylhexyl ester | 9 | 18 | 27 | 36 | 45 |

TABLE 2

Hydrophilic Polymers 46 to 57
(The numbers in the table indicate numbers of the hydrophilic polymers)
Composition Ratio of Formula (1)/Formula (2) = 80/20 (% by mole)

| Formula (2) | Formula (1) —C(=O)NH$_2$ | | | | |
|---|---|---|---|---|---|
| | Mw | | | | |
| | 200,000 | 100,000 | 50,000 | 30,000 | 10,000 |
| butyl ester | 46 | 47 | 48 | 3 | 49 |

TABLE 2-continued

Hydrophilic Polymers 46 to 57
(The numbers in the table indicate numbers of the hydrophilic polymers)
Composition Ratio of Formula (1)/Formula (2) = 80/20 (% by mole)

Formula (1): acrylamide (–CH2–CH(C(=O)NH2)–)

| Formula (2) | Mw | | | | |
|---|---|---|---|---|---|
| | 200,000 | 100,000 | 50,000 | 30,000 | 10,000 |
| isobutyl acrylate | 50 | 51 | 52 | 4 | 53 |
| tert-butyl acrylate | 54 | 55 | 56 | 5 | 57 |

TABLE 3

Hydrophilic Polymers 58 to 69
(The numbers in the table indicate numbers of the hydrophilic polymers)
Mw = 30,000

Formula (1): acrylamide (–CH2–CH(C(=O)NH2)–)

| Formula (2) | Composition Ratio Formula (1)/Formula (2) (% by mole) | | | | |
|---|---|---|---|---|---|
| | 95/5 | 90/10 | 85/15 | 80/20 | 70/30 |
| n-butyl acrylate | 58 | 59 | 60 | 3 | 61 |
| isobutyl acrylate | 62 | 63 | 64 | 4 | 65 |
| tert-butyl acrylate | 66 | 67 | 68 | 5 | 69 |

Hydrophilic Polymers 70 to 78 (Composition Ratio and Mw are Shown in Table 4)
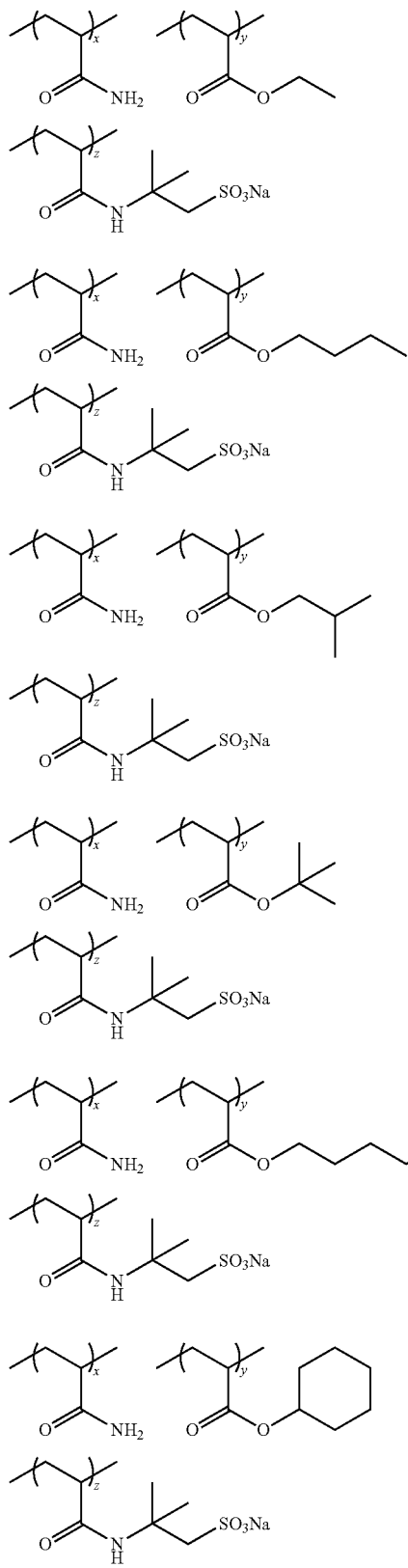
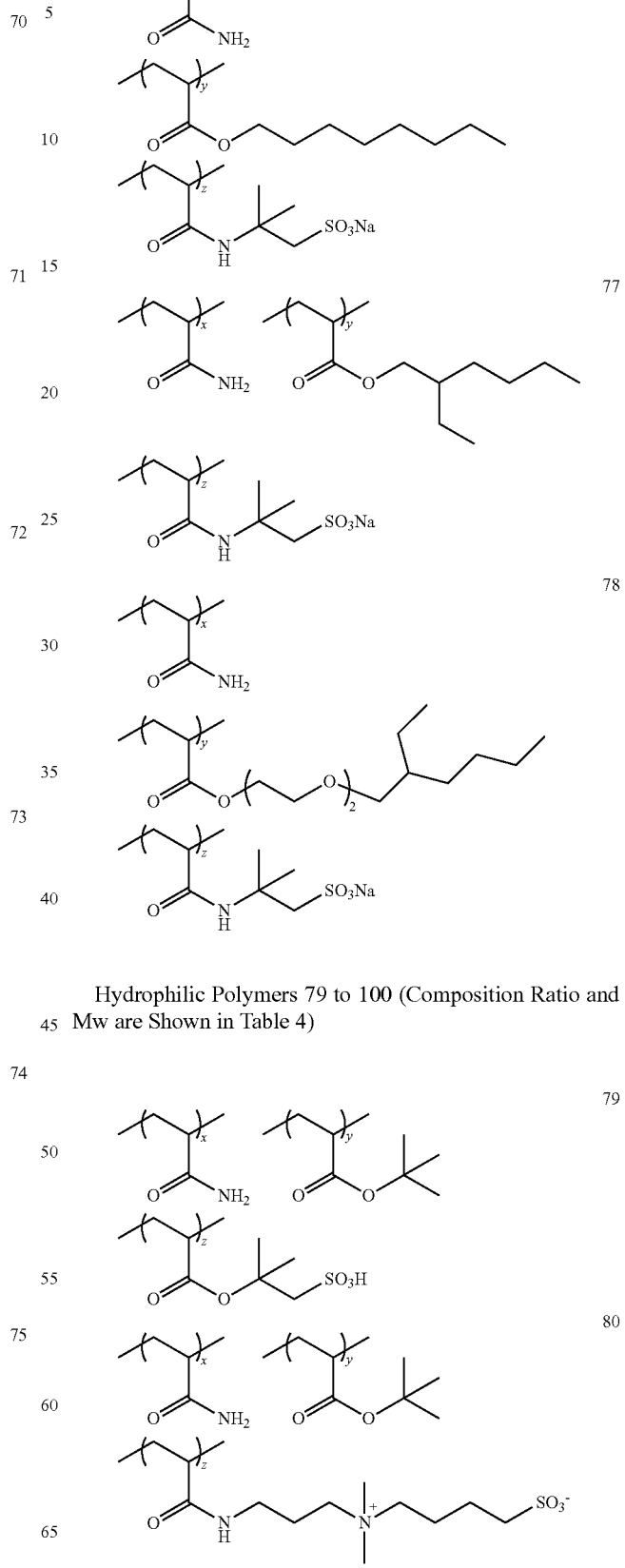
Hydrophilic Polymers 79 to 100 (Composition Ratio and Mw are Shown in Table 4)
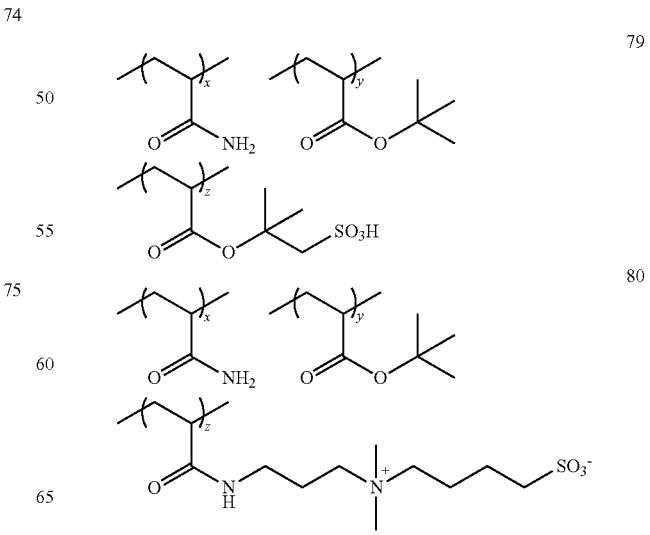

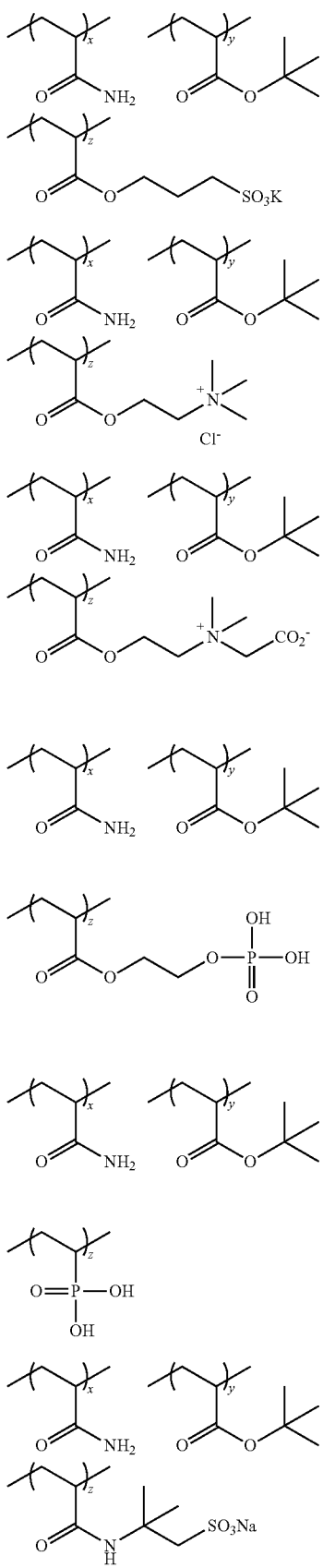

TABLE 4

Composition Ratio and Mw of Hydrophilic Polymers 70 to 100

| Number of Hydrophilic Polymer | Composition Ratio (% by mole) | | | Mw |
|---|---|---|---|---|
| | x | y | z | |
| 70 | 74 | 25 | 1 | 20,000 |
| 71 | 74 | 25 | 1 | 20,000 |
| 72 | 74 | 25 | 1 | 20,000 |
| 73 | 74 | 25 | 1 | 20,000 |
| 74 | 74 | 25 | 1 | 20,000 |
| 75 | 74 | 25 | 1 | 20,000 |
| 76 | 74 | 25 | 1 | 20,000 |
| 77 | 74 | 25 | 1 | 20,000 |
| 78 | 74 | 25 | 1 | 20,000 |
| 79 | 74 | 25 | 1 | 20,000 |
| 80 | 74 | 25 | 1 | 20,000 |
| 81 | 74 | 25 | 1 | 20,000 |
| 82 | 74 | 25 | 1 | 20,000 |
| 83 | 74 | 25 | 1 | 20,000 |
| 84 | 74 | 25 | 1 | 20,000 |
| 85 | 74 | 25 | 1 | 20,000 |
| 86 | 94 | 5 | 1 | 20,000 |
| 87 | 89 | 10 | 1 | 20,000 |
| 88 | 84 | 15 | 1 | 20,000 |
| 89 | 79 | 20 | 1 | 20,000 |
| 90 | 72 | 27 | 1 | 20,000 |
| 91 | 74 | 25 | 1 | 200,000 |
| 92 | 74 | 25 | 1 | 100,000 |
| 93 | 74 | 25 | 1 | 50,000 |
| 94 | 74 | 25 | 1 | 30,000 |
| 95 | 74 | 25 | 1 | 10,000 |
| 96 | 74.7 | 25 | 0.3 | 20,000 |
| 97 | 73.5 | 25 | 1.5 | 20,000 |
| 98 | 73 | 25 | 2 | 20,000 |
| 99 | 72 | 25 | 3 | 20,000 |
| 100 | 70 | 25 | 5 | 20,000 |

The content of the hydrophilic polymer (E) according to the invention in the protective layer is preferably from 20 to 97% by weight, more preferably from 30 to 95% by weight, particularly preferably from 40 to 90% by weight, based on the solid content of the protective layer. In the range described above, the lithographic printing plate precursor providing better ink receptivity and better printing durability is obtained.

The protective layer according to the invention preferably contains (F) an inorganic stratiform compound in order to obtain good oxygen-blocking property with a thin layer.

The inorganic stratiform compound is a particle having a thin tabular shape and includes, for instance, mica, for example, natural mica represented by the following formula: A (B, C)$_{2-5}$ D$_4$ O$_{10}$ (OH, F, O)$_2$, (wherein A represents any of Li, K, Na, Ca, Mg and an organic cation, B and C each represents any of Fe(II), Fe(III), Mn, Al, Mg and V, and D represents Si or Al) or synthetic mica, talc represented by the following formula: 3MgO.4SiO.H$_2$O, taeniolite, montmorillonite, saponite, hectorite and zirconium phosphate.

Examples of the natural mica include muscovite, paragonite, phlogopite, biotite and lepidolite. Examples of the synthetic mica include non-swellable mica, for example, flumphlogopite KMg$_3$(AlSi$_3$O$_{10}$)F$_2$ or potassium tetrasilicic mica KMg$_{2.5}$(Si$_4$O$_{10}$)F$_2$, and swellable mica, for example, Na tetrasilicic mica NaMg$_{2.5}$(Si$_4$O$_{10}$)F$_2$, Na or Li taeniolite (Na, Li)Mg$_2$Li(Si$_4$O$_{10}$)F$_2$, or montmorillonite-based Na or Li hectorite (Na, Li)$_{1/8}$Mg$_{2/5}$Li$_{1/8}$(Si$_4$O$_{10}$)F$_2$. Synthetic smectite is also useful.

Of the inorganic stratiform compounds, mica is preferred and fluorine-based swellable mica, which is a synthetic inorganic stratiform compound, is particularly useful. Specifically, the swellable synthetic mica and an swellable clay mineral, for example, montmorillonite, saponite, hectorite or bentonite have a stratiform structure comprising a unit crystal lattice layer having thickness of approximately 10 to 15 angstroms, and metallic atom substitution in the lattices thereof is remarkably large in comparison with other clay minerals. As a result, the lattice layer results in lack of positive charge and to compensate it, a cation, for example, $Li^+$, $Na^+$, $Ca^{2+}$, $Mg^{2+}$ or an organic cation is adsorbed between the lattice layers. The inorganic stratiform compound swells upon contact with water. When share is applied under such condition, the stratiform crystal lattices are easily cleaved to form a stable sol in water. The bentonite and swellable synthetic mica have strongly such tendency.

As for the shape of the inorganic stratiform compound, from the standpoint of control of diffusion, the thinner the thickness or the larger the plain size as long as smoothness of coated surface and transmission of actinic radiation are not damaged, the better. Therefore, an aspect ratio of the inorganic stratiform compound is preferably 20 or more, more preferably 100 or more, and particularly preferably 200 or more. The aspect ratio is a ratio of major axis to thickness of particle and can be determined, for example, from a projection drawing of particle by a microphotography. The larger the aspect ratio, the greater the effect obtained.

The specific total amount of the inorganic stratiform compound can not be generally defined because it is varied depending on the inorganic stratiform compound to be used, but it is preferably from 3 to 80% by weight, more preferably from 5 to 70% by weight, most preferably from 10 to 60% by weight, based on the total solid content of the protective layer. In the range described above, good oxygen-blocking property can be obtained.

As for a particle diameter of the inorganic stratiform compound, an average diameter thereof is preferably from 1 to 20 μm, more preferably from 1 to 10 μm, and particularly preferably from 2 to 5 μm. When the particle diameter is 1 μm or more, the inhibition of permeation of oxygen or moisture is sufficient and the effect of the inorganic stratiform compound can preferably be satisfactorily achieved. On the other hand, when it is 20 μm or less, the dispersion stability of the particle in the coating solution is sufficient to preferably conduct the stable coating. An average thickness of the particle is preferably 0.1 μm or less, more preferably 0.05 μm or less, and particularly preferably 0.01 μm or less. For example, with respect to the swellable synthetic mica that is the representative compound of the inorganic stratiform compound, the thickness is preferably approximately from 1 to 50 nm and the plain size is preferably approximately from 1 to 20 μm.

When such an inorganic stratiform compound particle having a large aspect ratio is incorporated into the protective layer, strength of the coated layer increases and penetration of oxygen or moisture can be effectively inhibited and thus, the protective layer can be prevented from deterioration due to deformation, and even when the lithographic printing plate precursor is preserved for a long period of time under a high humidity condition, it is prevented from decrease in the image-forming property of the lithographic printing plate precursor due to the change of humidity and the effect of excellent preservation stability can be obtained.

Further, a fluorine-based compound, a silicone-based compound or a wax-based emulsion can be added to the protective layer in order to prevent tackiness. When such a compound is added, the compound moves to the surface of the protective layer so that the tackiness resulting from the hydrophilic polymer disappears. The amount of the compound added is preferably from 0.1 to 5% by weight, and more preferably from 0.5 to 2.0% by weight, of the protective layer.

To the coating solution for protective layer can be added known additives, for example, an anionic surfactant, a nonionic surfactant, a cationic surfactant or a fluorine-based surfactant for improving the coating property or a water-soluble plasticizer for improving the physical property of the protective layer. Examples of the water-soluble plasticizer include propionamide, cyclohexane diol, glycerin and sorbitol. Further, to the coating solution for protective layer may be added known additives for improving properties, for example, adhesion property to the image-recording layer, preservation stability of the coating solution or ink receptivity. The coating solution for protective layer is preferably an aqueous solution in which the components described above are dissolved.

The protective layer can be coated on the image-recording layer by a known method. The coating amount of the protective layer is preferably in a range form 0.01 to 10 $g/m^2$, more preferably in a range from 0.02 to 3 $g/m^2$, most preferably in a range from 0.02 to 1 $g/m^2$, in terms of the coating amount after drying.

(Image-recording Layer)

The image-recording layer according to the invention is an image-recording layer which is capable of forming an image by removing an unexposed area by an automatic development processor in the presence of a developer having pH of from 2 to 14 after exposure and contains (A) a sensitizing dye, (B) a polymerization initiator, (C) a polymerizable compound and (D) a polymer which is insoluble in water and alkali-soluble.

Hereinafter, each component capable of being incorporated into the image-recording layer will be described in order.

(A) Sensitizing Dye

The sensitizing dye for use in the image-recording layer can be used without particular limitation as far as it absorbs light at the image exposure to form the excited state and provides energy to the polymerization initiator with electron transfer, energy transfer or heat generation thereby increasing the polymerization initiation function. In particularly, a sensitizing dye having an absorption maximum in a wavelength range from 300 to 450 nm or from 750 to 1,400 nm is preferably used.

Examples of the sensitizing dye having an absorption maximum in a wavelength range from 300 to 450 nm include dyes, for example, merocyanines, benzopyranes, coumarins, aromatic ketones, anthracenes, styryls and oxazoles.

Of the sensitizing dyes having an absorption maximum in a wavelength range from 300 to 450 nm, a dye represented by formula (I) shown below is more preferred in view of high sensitivity.

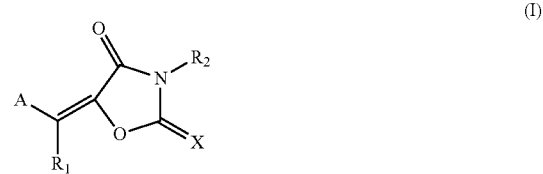

(I)

In formula (I), A represents an aryl group which may have a substituent or a heteroaryl group which may have a substituent, X represents an oxygen atom, a sulfur atom or $=N(R_3)$, and $R_1$, $R_2$ and $R_3$ each independently represents a monovalent non-metallic atomic group, or A and $R_1$ or $R_2$ and $R_3$ may be combined with each other to form an aliphatic or aromatic ring.

The formula (I) will be described in more detail below. $R_1$, $R_2$ and $R_3$ each independently represents a monovalent non-metallic atomic group, preferably a hydrogen atom, a substituted or unsubstituted alkyl group, a substituted or unsubstituted alkenyl group, a substituted or unsubstituted aryl group, a substituted or unsubstituted heteroaryl group, a substituted or unsubstituted alkoxy group, a substituted or unsubstituted alkylthio group, a hydroxy group or a halogen atom.

Specific examples of the sensitizing dye include compounds described in Paragraph Nos. [0047] to [0053] of JP-A-2007-58170.

Further, sensitizing dyes represented by formulae (II) and (III) shown below can also be used.

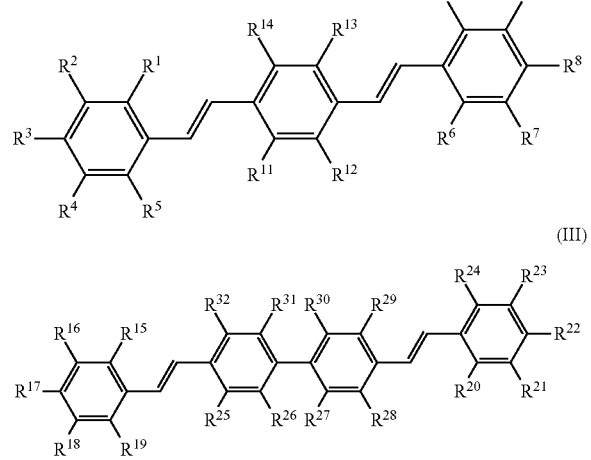

In formula (II), $R^1$ to $R^{14}$ each independently represents a hydrogen atom, an alkyl group, an alkoxy group, a cyano group or a halogen atom, provided that at least one of $R^1$ to $R^{10}$ represents an alkoxy group having 2 or more carbon atoms.

In formula (III), $R^{15}$ to $R^{32}$ each independently represents a hydrogen atom, an alkyl group, an alkoxy group, a cyano group or a halogen atom, provided that at least one of $R^{15}$ to $R^{24}$ represents an alkoxy group having 2 or more carbon atoms.

As specific examples of these sensitizing dyes, compounds described in EP-A-1,349,006 and WO 2005/029187 are preferably used.

Further, sensitizing dyes described in JP-A-2006-189604, JP-A-2007-171406, JP-A-2007-206216, JP-A-2007-206217, JP-A-2007-225701, JP-A-2007-225702, JP-A-2007-316582 and JP-A-2007-328243 are also preferably used.

Next, the sensitizing dye having an absorption maximum in a wavelength range from 750 to 1,400 (hereinafter, also referred to as an "infrared absorbing agent") is described below. The infrared absorbing agent used is preferably a dye or pigment.

As the dye, commercially available dyes and known dyes described in literatures, for example, *Senryo Binran (Dye Handbook)* compiled by The Society of Synthetic Organic Chemistry, Japan (1970) can be used. Specifically, the dyes include azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Of the dyes, cyanine dyes, squarylium dyes, pyrylium dyes, nickel thiolate complexes and indolenine cyanine dyes are particularly preferred. The cyanine dyes and indolenine cyanine dyes are more preferred. As particularly preferred examples of the dye, a cyanine dye represented by formula (IV) shown below is exemplified.

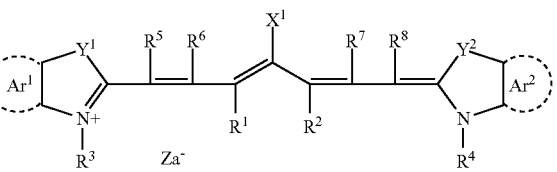

Formula (IV)

In formula (IV), $X^1$ represents a hydrogen atom, a halogen atom, $-N(R^9)(R^{10})$, $-X^2-L^1$ or a group shown below. $R^9$ and $R^{10}$, which may be the same or different, each represents an aromatic hydrocarbon group having from 6 to 10 carbon atoms, which may have a substituent, an alkyl group having from 1 to 8 carbon atoms or a hydrogen atom, or $R^9$ and $R^{10}$ may be combined with each other to from a ring, and preferably represents a phenyl group. $X^2$ represents an oxygen atom or a sulfur atom, $L^1$ represents a hydrocarbon group having from 1 to 12 carbon atoms, an aromatic cyclic group containing a hetero atom (a nitrogen atom, a sulfur atom, an oxygen atom, a halogen atom or a selenium atom) or a hydrocarbon group having from 1 to 12 carbon atoms and containing a hetero atom. $Xa^-$ in the formula below has the same meaning as $Za^-$ defined hereinafter. $R^a$ represents a hydrogen atom or a substituent selected from an alkyl group, an aryl group, a substituted or unsubstituted amino group and a halogen atom.

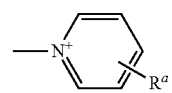

$R^1$ and $R^2$ in formula (IV) each independently represents a hydrocarbon group having from 1 to 12 carbon atoms. In view of the preservation stability of the coating solution for the image-recording layer, it is preferred that $R^1$ and $R^2$ each represents a hydrocarbon group having two or more carbon atoms. Also, $R^1$ and $R^2$ may be combined with each other to form a ring, and in case of forming the ring, to form a 5-membered ring or 6-membered ring is particularly preferred.

$Ar^1$ and $Ar^2$, which may be the same or different, each represents an aryl group which may have a substituent. Preferred examples of the aryl group include a benzene ring group and a naphthalene ring group. Preferred examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferred examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (IV) has an anionic substituent in the structure thereof and neutralization of charge is not needed. Preferred examples of the counter ion for $Za^-$ include a halide ion, a perchlorate ion, a tetrafluoroborate ion, a hexafluorophosphate ion and a sulfonate ion, and particularly preferred examples thereof include a perchlorate ion, a hexafluorophosphate ion and an arylsulfonate ion in view of the preservation stability of the coating solution for the image-recording layer.

Specific examples of the cyanine dye represented by formula (IV) include compounds described in Paragraph Nos. [0017] to [0019] of JP-A-2001-133969, Paragraph Nos. [0016] to [0021] of JP-A-2002-23360 and Paragraph Nos. [0012] to [0037] of JP-A-2002-40638, preferably compounds described in Paragraph Nos. [0034] to [0041] of JP-A-2002-278057 and Paragraph Nos. [0080] to [0086] of JP-A-2008-195018, and particularly preferably compounds described in Paragraph Nos. [0035] to [0043] of JP-A-2007-90850.

Also, compounds described in Paragraph Nos. [0008] to [0009] of JP-A-5-5005 and Paragraph Nos. [0022] to [0025] of JP-A-2001-222101 are preferably used.

The infrared absorbing dyes may be used only one kind or in combination of two or more kinds thereof and it may also be used together with an infrared absorbing agent other than the infrared absorbing dye, for example, a pigment. As the pigment, compounds described in Paragraph Nos. [0072] to [0076] of JP-A-2008-195018 are preferred.

The content of the sensitizing dye is preferably from 0.05 to 30 parts by weight, more preferably from 0.1 to 20 parts by weight, particularly preferably from 0.2 to 10 parts by weight, per 100 parts by weight of the total solid content of the image-recording layer.

(B) Polymerization Initiator

The polymerization initiator (B) for use in the invention is a compound which initiates or accelerates polymerization of the polymerizable compound (C). The polymerization initiator for use in the invention is preferably a radical polymerization initiator and, for example, a known thermal polymerization initiator, a compound containing a bond having small bond dissociation energy and a photopolymerization initiator can be utilized.

The polymerization initiator used in the invention includes, for example, (a) an organic halide, (b) a carbonyl compound, (c) an azo compound, (d) an organic peroxide, (e) a metallocene compound, (f) an azido compound, (g) a hexaarylbiimidazole compound, (h) an organic borate compound, (i) a disulfone compound, (j) an oxime ester compound and (k) an onium salt compound.

As the organic halide (a), compounds described in Paragraph Nos. [0022] to [0023] of JP-A-2008-195018 are preferred.

As the carbonyl compound (b), compounds described in Paragraph No. [0024] of JP-A-2008-195018 are preferred.

As the azo compound (c), for example, azo compounds described in JP-A-8-108621 are used.

As the organic peroxide (d), for example, compounds described in Paragraph No. [0025] of JP-A-2008-195018 are preferred.

As the metallocene compound (e), for example, compounds described in Paragraph No. [0026] of JP-A-2008-195018 are preferred.

As the azido compound (f), compound, for example, 2,6-bis(4-azidobenzylidene)-4-methylcyclohexanone is exemplified.

As the hexaarylbiimidazole compound (g), for example, compounds described in Paragraph No. [0027] of JP-A-2008-195018 are preferred.

As the organic borate compound (h), for example, compounds described in Paragraph No. [0026] of JP-A-2008-195018 are preferred.

As the disulfone compound (i), for example, compounds described in JP-A-61-166544 and JP-A-2002-328465 are exemplified.

As the oxime ester compound (j), for example, compounds described in Paragraph Nos. [0028] to [0030] of JP-A-2008-195018 are preferred.

As the onium salt compound (k), onium salts, for example, diazonium salts described in S. I. Schlesinger, *Photogr. Sci. Eng.*, 18, 387 (1974), T. S. Bal et al., *Polymer*, 21, 423 (1980) and JP-A-5-158230, ammonium salts described in U.S. Pat. No. 4,069,055 and JP-A-4-365049, phosphonium salts described in U.S. Pat. Nos. 4,069,055 and 4,069,056, iodonium salts described in European Patent 104,143, U.S. Patent Publication No. 2008/0311520, JP-A-2-150848, JP-A-2008-195018 and J. V. Crivello et al., *Macromolecules*, 10 (6), 1307 (1977), sulfonium salts described in European Patents 370, 693, 233,567, 297,443 and 297,442, U.S. Pat. Nos. 4,933, 377, 4,760,013, 4,734,444 and 2,833,827, German Patents 2,904,626, 3,604,580 and 3,604,581, selenonium salts described in J. V. Crivello et al., *J. Polymer Sci., Polymer Chem. Ed.*, 17, 1047 (1979), arsonium salts described in C. S. Wen et al., *Teh, Proc. Conf. Rad. Curing ASIA*, p. 478, Tokyo, October (1988), and azinium salts described in JP-A-2008-195018 are exemplified.

Of the polymerization initiators, the onium salt, particularly, the iodonium salt, sulfonium salt or azinium salt is more preferred. Specific examples of these compounds are set forth below, but the invention should not be construed as being limited thereto.

Of the iodonium salts, diphenyliodonium salts are preferred, diphenyliodonium salts substituted with an electron donating group, for example, an alkyl group or an alkoxy group are more preferred, and asymmetric diphenyliodonium salts are still more preferred. Specific examples thereof include diphenyliodonium hexafluorophosphate, 4-methoxyphenyl-4-(2-methylpropyl)phenyliodonium hexafluorophosphate, 4-(2-methylpropyl)phenyl-p-tolyliodonium hexafluorophosphate, 4-hexyloxyphenyl-2,4,6-trimethoxyphenyliodonium hexafluorophosphate, 4-hexyloxyphenyl-2,4-diethoxyphenyliodonium tetrafluoroborate, 4-octyloxyphenyl-2,4,6-trimethoxyphenyliodonium 1-perfluorobutanesulfonate, 4-octyloxyphenyl-2,4,6-trimethoxyphenyliodonium hexafluorophosphate and bis(4-tert-butylphenyl)iodonium tetraphenylborate.

Examples of the sulfonium salt include triphenylsulfonium hexafluorophosphate, triphenylsulfonium benzoylformate, bis(4-chlorophenyl)phenylsulfonium benzoylformate, bis(4-chlorophenyl)-4-methylphenylsulfonium tetrafluoroborate, tris(4-chlorophenyl)sulfonium 3,5-bis(methoxycarbonyl)benzenesulfonate and tris(4-chlorophenyl)sulfonium hexafluorophosphate.

Examples of the azinium salt include 1-cyclohexylmethyloxypyridinium hexafluorophosphate, 1-cyclohexyloxy-4-phenylpyridinium hexafluorophosphate, 1-ethoxy-4-phenylpyridinium hexafluorophosphate, 1-(2-ethylhexyloxy)-4-phenylpyridinium hexafluorophosphate, 4-chloro-1-cyclohexylmethyloxypyridinium hexafluorophosphate, 1-ethoxy-4-cyanopyridinium hexafluorophosphate, 3,4- dichloro-1-(2-ethylhexyloxy)pyridinium hexafluorophosphate, 1-benzyloxy-4-phenylpyridinium hexafluorophosphate, 1-phenethyloxy-4-phenylpyridinium hexafluorophosphate, 1-(2-ethylhexyloxy)-4-phenylpyridinium p-toluenesulfonate, 1-(2-ethylhexyloxy)-4-phenylpyridinium perfluorobutanesulfonate, 1-(2-ethylhexyloxy)-4-phenylpyridinium bromide and 1-(2-ethylhexyloxy)-4-phenylpyridinium tetrafluoroborate.

The polymerization initiator according to the invention can be added to the image-recording layer preferably in an amount of from 0.1 to 50% by weight, more preferably from 0.5 to 30% by weight, particularly preferably from 0.8 to 20% by weight, based on the total solid content constituting the image-recording layer. In the range described above, good sensitivity and good stain resistance in the non-image area at the time of printing are obtained.

(C) Polymerizable Compound

The polymerizable compound for use in the image-recording layer according to the invention is an addition-polymerizable compound having at least one ethylenically unsaturated double bond and it is selected from compounds having at least one, preferably two or more, terminal ethylenically unsaturated double bonds. The polymerizable compound has a chemical form, for example, a monomer, a prepolymer, specifically, a dimer, a trimer or an oligomer, or a mixture thereof.

Examples of the monomer include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with a polyhydric alcohol compound and amides of an unsaturated carboxylic acid with a polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or an epoxy compound, or a dehydration condensation reaction product of the unsaturated carboxylic acid ester or amide with a monofunctional or polyfunctional carboxylic acid is also preferably used. Moreover, an addition reaction product of an unsaturated carboxylic acid ester or amide having an electrophilic substituent, for example, an isocyanate group or an epoxy group with a monofunctional or polyfunctional alcohol, amine or thiol, or a substitution reaction product of an unsaturated carboxylic acid ester or amide having a releasable substituent, for example, a halogeno group or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used. These compounds are described in references including JP-T-2006-508380 (the term "JP-T" as used herein means a published Japanese translation of a PCT patent application), JP-A-2002-287344, JP-A-2008-256850, JP-A-2001-342222, JP-A-9-179296, JP-A-9-179297, JP-A-9-179298, JP-A-2004-294935, JP-A-2006-243493, JP-A-2002-275129, JP-A-2003-64130, JP-A-2003-280187 and JP-A-10-333321.

Specific examples of the monomer, which is an ester of a polyhydric alcohol compound with an unsaturated carboxylic acid, include, as an acrylic acid ester, for example, ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO) modified triacrylate and polyester acrylate oligomer. As a methacrylic acid ester, for example, tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl]dimethylmethane and bis[p-(methacryloxyethoxy)phenyl]dimethylmethane are exemplified. Specific examples of the monomer, which is an amide of a polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide.

Urethane type addition-polymerizable compounds produced using an addition reaction between an isocyanate and a hydroxy group are also preferably used and specific examples thereof include vinylurethane compounds having two or more polymerizable vinyl groups per molecule obtained by adding a vinyl monomer containing a hydroxy group represented by formula (A) shown below to a polyisocyanate compound having two or more isocyanate groups per molecule, described in JP-B-48-41708.

$$CH_2=C(R^4)COOCH_2CH(R^5)OH \quad (A)$$

wherein $R^4$ and $R^5$ each independently represents H or $CH_3$.

Also, urethane acrylates as described in JP-A-51-37193, JP-B-2-32293, JP-B-2-16765, JP-A-2003-344997 and JP-A-2006-65210, urethane compounds having an ethylene oxide skeleton described in JP-B-58-49860, JP-B-56-17654, JP-B-62-39417, JP-B-62-39418, JP-A-2000-250211 and JP-A-2007-94138, and urethane compounds having a hydrophilic group described in U.S. Pat. No. 7,153,632, JP-T-8-505958, JP-A-2007-293221 and JP-A-2007-293223 are preferably used.

Details of the method of using the polymerizable compound, for example, selection of the structure, individual or combination use or an amount added, can be appropriately determined in accordance with the characteristic design of the final lithographic printing plate precursor. The polymerizable compound is used preferably in a range from 5 to 75% by weight, more preferably in a range from 10 to 70% by weight, particularly preferably in a range from 15 to 60% by weight, based on the total solid content of the image-recording layer.

(D) Polymer Which is Insoluble in Water and Alkali-soluble

Although the chemical structure of the binder polymer is not particularly restricted, from the standpoint of solubility in a developer, that is, development property, an organic polymer having an acid group is preferred and particularly, an organic polymer having a carboxylic acid or salt thereof is more preferred.

As the binder polymer which can be used in the image-recording layer for the lithographic printing plate precursor according to the invention, an aqueous alkali-soluble or swellable organic polymer having a carboxylic acid is exemplified. Examples of such an organic polymer preferably include addition polymers having a carboxylic acid group in their side chains, for example, polymers described in JP-B-59-44615, JP-B-54-34327, JP-B-58-12577, JP-B-54-25957, JP-A-54-92723, JP-A-59-53836 and JP-A-59-71048, specifically, methacrylic acid copolymers, acrylic acid copolymers, itaconic acid copolymers, crotonic acid copolymers, maleic acid copolymers and partially esterified maleic acid copolymers. As the binder polymer, a copolymer containing a monomer unit derived from a (meth)acrylate having a carboxylic acid (salt) group is preferred.

Also, an acidic cellulose derivative having a carboxylic acid group in its side chain and a product obtained by adding a cyclic acid anhydride to an addition polymer having a hydroxy group are useful. Further, polyurethane resins described in JP-B-7-120040, JP-B-7-120041, JP-B-7-120042, JP-B-8-12424, JP-A-63-287944, JP-A-63-287947, JP-A-1-271741 and JP-A-11-352691 are also useful as the aqueous alkali-soluble or swellable binder. As the binder polymer for use in the invention, an acrylic resin, a methacrylic resin or a urethane resin is preferably employed.

One preferred example of material for the binder polymer according to the invention is a copolymer having (a) a monomer unit having a carboxylic acid group (including its salt) and (b) a monomer unit for imparting a radical crosslinking property.

The monomer unit (a) having a carboxylic acid group is not particularly restricted and structures described in JP-A-2002-40652 and Paragraph Nos. [0059] to [0075] of JP-A-2005-300650 are preferably used.

The monomer unit (b) for imparting a radical crosslinking property is not particularly restricted and structures described in Paragraph Nos. [0041] to [0053] of JP-A-2007-248863 are preferably used.

The binder polymer according to the invention may contain a monomer unit derived from an ethylenically unsaturated compound which contains neither the monomer unit (a) having a carboxylic acid group nor the monomer unit (b) for imparting a radical crosslinking as a copolymerization component.

As such a monomer unit, a monomer unit derived from a (meth)acrylate or (meth)acrylamide is preferred. Particularly, a monomer unit derived from (meth)acrylamide described in Paragraph Nos. [0061] to [0084] of JP-A-2007-272134 is preferably used. The content of such a monomer unit is preferably from 5 to 50 units, more preferably from 5 to 35 units, still more preferably from 5 to 25 units, when the total number of monomer units is taken as 100.

In the image-recording layer according to the invention, in addition to the addition polymer containing a combination of the monomer units described above, a urethane resin having a crosslinkable group in its side chain can also be used as the binder polymer. The term "crosslinkable group" as used herein means a group capable of crosslinking the binder polymer upon a chemical reaction which is caused in the image-recording layer, when the lithographic printing plate precursor is exposed to light. A chemical structure of the crosslinkable group is not particularly restricted as long as the crosslinkable group has such a function and, for example, an ethylenically unsaturated group is preferred as a functional group capable of undergoing an addition polymerization reaction. Also, functional groups described in Paragraph Nos. [0130] to [0139] of JP-A-2007-17948 are exemplified.

The polyurethane resin having a crosslinkable group in its side chain preferably used in the invention can be obtained by a polyaddition reaction of (i) a diisocyanate compound, (ii) a diol compound having a carboxyl group, (iii) a diisocyanate compound having a crosslinkable group and, if desired, (iv) a diol compound containing no carboxyl group and (v) a compound having an amino group.

The compounds of (i), (ii) and (iii) above include compounds represented by formulae (4) to (10) and specific examples thereof described in Paragraph Nos. [0142] to [0167] of JP-A-2007-17948. The compound of (iv) above include compounds represented by formula (A'), formulae (a) to (e), formulae (11) to (22) and specific compounds described in Paragraph Nos. [0180] to [0225] of JP-A-2007-17948. The compound of (v) above include compounds represented by formulae (31) and (32) and specific compounds described in Paragraph Nos. [0227] to [0230] of JP-A-2007-17948. In addition to the polyurethane resin described above, a polyurethane resin obtained by introducing a crosslinkable group into polyurethane having a carboxyl group by a polymer reaction as described in JP-A-2003-270775 may also be exemplified.

The binder polymer for use in the invention preferably has an appropriate molecular weight in order to maintain the development property of the image-recording layer of lithographic printing plate precursor. The weight average molecular weight (Mw) thereof is preferably from 5,000 to 300,000, and more preferably from 20,000 to 150,000.

Although the binder polymer can be incorporated into the polymerizable composition in an appropriate amount, the content of the binder polymer in the polymerizable composition is preferably from 10 to 90% by weight, and more preferably from 30 to 80% by weight.

(H) Other Components

The image-recording layer according to the invention may further contain other components, if desired.

(1) Hydrophobilizing Precursor

According to the invention, a hydrophobilizing precursor can be used in order to improve the printing durability. The hydrophobilizing precursor for use in the invention is a fine particle capable of converting the image-recording layer to be hydrophobic when heat is applied. The fine particle is preferably at least one fine particle selected from hydrophobic thermoplastic polymer fine particle, thermo-reactive polymer fine particle, polymer fine particle having a polymerizable group, microcapsule containing a hydrophobic compound encapsulated and microgel (crosslinked polymer fine particle).

As the hydrophobic thermoplastic polymer fine particle, hydrophobic thermoplastic polymer fine particles described, for example, in *Research Disclosure*, No. 33303, January (1992), JP-A-9-123387, JP-A-9-131850, JP-A-9-171249, JP-A-9-171250 and European Patent 931,647 are preferably exemplified.

Specific examples of the polymer constituting the polymer fine particle include a homopolymer or copolymer of a monomer, for example, ethylene, styrene, vinyl chloride, methyl acrylate, ethyl acrylate, methyl methacrylate, ethyl methacrylate, vinylidene chloride, acrylonitrile, vinyl carbazole or an acrylate or methacrylate having a polyalkylene structure and a mixture thereof. Among them, polystyrene, a copolymer containing styrene and acrylonitrile and polymethyl methacrylate are more preferred.

The average particle size of the hydrophobic thermoplastic polymer fine particle for use in the invention is preferably from 0.01 to 2.0 μm.

The thermo-reactive polymer fine particle for use in the invention includes polymer fine particle having a thermo-reactive group and forms a hydrophobilized region by crosslinkage due to thermal reaction and change in the functional group involved therein.

As the thermo-reactive group of the polymer fine particle having a thermo-reactive group for use in the invention, although a functional group performing any reaction can be used as long as a chemical bond is formed, a polymerizable group is preferred. For instance, an ethylenically unsaturated group (for example, an acryloyl group, a methacryloyl group, a vinyl group or an allyl group) performing a radical polymerization reaction, a cationic polymerizable group (for example, a vinyl group, a vinyloxy group, an epoxy group or an oxetanyl group), an isocyanate group performing an addition reaction or a blocked form thereof, an epoxy group, a vinyloxy group and a functional group having an active hydrogen atom (for example, an amino group, a hydroxy group or a carboxyl group) as the reaction partner thereof, a carboxyl group performing a condensation reaction and a hydroxyl group or an amino group as the reaction partner thereof, and an acid anhydride performing a ring opening addition reaction and an amino group or a hydroxyl group as the reaction partner thereof are preferably exemplified.

As the microcapsule for use in the invention, microcapsule having all or part of the constituting components of the image-recording layer encapsulated as described, for example, in JP-A-2001-277740 and JP-A-2001-277742 is exemplified. The constituting components of the image-recording layer may be present outside the microcapsule. It is a preferred embodiment of the image-recording layer containing microcapsule that hydrophobic constituting components are encapsulated in microcapsule and hydrophilic components are present outside the microcapsule.

The image-recording layer according to the invention may be an embodiment containing a crosslinked resin particle, that is, microgel. The microgel can contain a part of the constituting components of the image-recording layer at least one of in the inside and on the surface thereof. Particularly, an embodiment of a reactive microgel containing a radical polymerizable group on the surface thereof is preferred in view of the image-forming sensitivity and printing durability.

As a method of microencapsulation or microgelation of the constituting components of the image-recording layer, known methods can be used.

The average particle size of the microcapsule or microgel is preferably from 0.01 to 3.0 μm, more preferably from 0.05 to 2.0 μm, particularly preferably from 0.10 to 1.0 μm. In the range described above, good resolution and good preservation stability can be achieved.

The content of the hydrophobilizing precursor is preferably in a range from 5 to 90% by weight based on the total solid content of the image-recording layer.

(2) Others

Other components, for example, a hydrophilic low molecular weight compound, an oil-sensitizing agent, a surfactant, a coloring agent, a print-out agent, a polymerization inhibitor, a higher fatty acid derivative, a plasticizer, an inorganic fine particle, an inorganic stratiform compound or a co-sensitizer or chain transfer agent may further be added to the image-recording layer. Specifically, compounds and amounts added thereof described, for example, in Paragraph Nos. [0114] to [0159] of JP-A-2008-284817, Paragraph Nos. [0023] to [0027] of JP-A-2006-91479, Paragraph No. [0060] of U.S. Patent Publication No. 2008/0311520 and Paragraph Nos. [0089] to [0105] of JP-A-2009-208458 are preferably used.

<Formation of Image-recording Layer>

The image-recording layer according to the invention is formed by dispersing or dissolving each of the necessary components described above in a known solvent to prepare a coating solution and coating the solution on a support by a known method, for example, bar coater coating and drying as described, or example, in Paragraph Nos. [0142] to [0143] of JP-A-2008-195018. The coating amount (solid content) of the image-recording layer formed on the support after coating and drying may be varied according to the intended purpose but is in general preferably from 0.3 to 3.0 g/m$^2$. In the range described above, good sensitivity and good film property of the image-recording layer can be obtained.

(Undercoat Layer)

In the lithographic printing plate precursor according to the invention, an undercoat layer (also referred to as an intermediate layer) is preferably provided between the image-recording layer and the support. The undercoat layer strengthens adhesion between the support and the image-recording layer in the exposed area and makes removal of the image-recording layer from the support easy in the unexposed area, thereby contributing improvement in the development property without accompanying degradation of the printing durability. Further, it is advantageous that in the case of infrared laser exposure, since the undercoat layer acts as a heat insulating layer, decrease in sensitivity due to diffusion of heat generated upon the exposure into the support is prevented.

As a compound for use in the undercoat layer, a polymer having an adsorbing group capable of adsorbing to a surface of support and a hydrophilic group is exemplified. In order to improve an adhesion property to the image-recording layer, a polymer having a crosslinkable group in addition to the adsorbing group and hydrophilic group is preferred. The compound may be a low molecular weight compound or a polymer compound. The compounds may be used in mixture of two or more thereof, if desired.

As the polymer compound, a copolymer of a monomer having an adsorbing group, a monomer having a hydrophilic group and a monomer having a crosslinkable group is preferred. As the adsorbing group capable of adsorbing to a surface of support, a phenolic hydroxy group, a carboxyl group, —PO$_3$H$_2$, —OPO$_3$H$_2$, —CONHSO$_2$—, —SO$_2$NHSO$_2$— or —COCH$_2$COCH$_3$ is preferred. As the hydrophilic group, a sulfo group or a salt thereof or a salt of a carboxyl group is preferred. As the crosslinkable group, for example, a methacryl group or an allyl group is preferred.

The polymer compound may contain a crosslinkable group introduced by a salt formation between a polar substituent of the polymer compound and a compound containing a substituent having a counter charge to the polar substituent of the polymer compound and an ethylenically unsaturated bond and may also be further copolymerized with a monomer other than those described above, preferably a hydrophilic monomer.

Specifically, a silane coupling agent having an addition-polymerizable ethylenic double bond reactive group described in JP-A-10-282679 and a phosphorus compound having an ethylenic double bond reactive group described in JP-A-2-304441 are preferably exemplified. Low molecular weight compounds or polymer compounds having a crosslinkable group (preferably an ethylenically unsaturated bond group), a functional group capable of interacting with a surface of support and a hydrophilic group described in JP-A-2005-238816, JP-A-2005-125749, JP-A-2006-239867 and JP-A-2006-215263 are also preferably used.

Polymer compounds having an adsorbing group capable of adsorbing to a surface of support, a hydrophilic group and a crosslinkable group described in JP-A-2005-125749 and JP-A-2006-188038 are more preferred.

The content of the unsaturated double bond in the polymer compound for undercoat layer is preferably from 0.1 to 10.0 mmol, most preferably from 0.2 to 5.5 mmol, based on 1 g of the polymer compound.

The weight average molecular weight of the polymer compound for undercoat layer is preferably 5,000 or more, and more preferably from 10,000 to 300,000.

The undercoat layer according to the invention may contain a chelating agent, a secondary or tertiary amine, a polymerization inhibitor or a compound containing an amino group or a functional group having polymerization inhibition ability and a group capable of interacting with a surface of aluminum support (for example, 1,4-diazabicyclo[2,2,2]octane (DABCO), 2,3,5,6-tetrahydroxy-p-quinone, chloranil, sulfophthalic acid, hydroxyethylethylenediaminetriacetic acid, dihydroxyethylethylenediaminediacetic acid or hydroxyethyliminodiacetic acid) in addition to the compound for the undercoat layer described above in order to prevent the occurrence of stain due to the preservation.

The undercoat layer is coated according to a known method. The coating amount (solid content) of the undercoat layer is preferably from 0.1 to 100 mg/m$^2$, and more preferably from 1 to 30 mg/m$^2$.

<Support>

As the support for use in the lithographic printing plate precursor according to the invention, a known support is used. Particularly, an aluminum plate subjected to roughening treatment and anodizing treatment according to a known method is preferred.

Also, an enlarging treatment or a sealing treatment of micropores of the anodized film described in JP-A-2001-253181 and JP-A-2001-322365 or a surface hydrophilizing treatment, for example, with an alkali metal silicate as described in U.S. Pat. Nos. 2,714,066, 3,181,461, 3,280,734 and 3,902,734 or polyvinyl phosphonic acid as described in U.S. Pat. Nos. 3,276,868, 4,153,461 and 4,689,272 may be appropriately selected and applied to the aluminum plate, if desired.

The support preferably has a center line average roughness from 0.10 to 1.2 μm.

The support according to the invention may have a backcoat layer containing an organic polymer compound described in JP-A-5-45885 or an alkoxy compound of silicon described in JP-A-6-35174, provided on the back surface thereof, if desired.

[Plate Making Method]

The plate making method of the lithographic printing plate precursor according to the invention is preferably a method including at least a process of imagewise exposing the lithographic printing plate precursor (hereinafter, also referred to as a "exposure process") and a process of development processing of the exposed lithographic printing plate precursor with a processing solution (hereinafter, also referred to as a "development process").

<Exposure Process>

Although the lithographic printing plate precursor for use in the invention can be subjected to image recording by a method of scanning exposure of digital data by laser, for example, visible laser or infrared laser or a method of exposing through a transparent original having an image recorded using a light source, for example, a halogen lamp or a high pressure mercury lamp, the method of scanning exposure of digital data by laser, for example, visible laser or infrared laser is preferred.

The wavelength of the exposure light source is desirably from 300 to 450 nm or from 750 to 1,400 nm. In case of exposing with light of 300 to 450 nm, the lithographic printing plate precursor having an image-recording layer containing a sensitizing dye having an absorption maximum in such a wavelength range is used. In case of exposing with light of 750 to 1,400 nm, the lithographic printing plate precursor containing an infrared absorbing agent which is a sensitizing dye having an absorption maximum in such a wavelength range is used. As the light source of 300 to 450 nm, a semiconductor laser is preferably used. As the light source of 750 to 1,400 nm, a solid laser or semiconductor laser emitting an infrared ray is preferably used. The exposure mechanism may be any of an internal drum system, an external drum system and a flat bed system.

<Development Process>

After the exposure, the lithographic printing plate precursor for use in the invention is developed with a developer having pH of from 2 to 14.

The processing with developer is ordinarily practiced according to the following processes: (1) removing the non-image area with a developer, (2) conducting gumming solution treatment and (3) drying in a drying process. Although the lithographic printing plate precursor for use in the invention can be developed according to the ordinary processes described above (conventional development), it is preferred to conduct processes (1) and (2) simultaneously (simple development). In any of the development methods, a water washing process for removing a protective layer may be provided before process (1). The development of process (1) is conducted according to a conventional manner at temperature approximately from 0 to 60° C., preferably approximately from 15 to 40° C., using, for example, a method wherein the imagewise exposed lithographic printing plate precursor is immersed in a developer and rubbed with a brush or a method wherein a developer is sprayed to the imagewise exposed lithographic printing plate precursor by a spray and the lithographic printing plate precursor is rubbed with a brush.

In case of the conventional development, a water washing process for removing an excess developer may be provided between process (1) and process (2). The developer used in process (1) is preferably a known alkali developer.

In case of the simple development, it is preferred that after the development and gumming treatment, an excess developer is removed using a squeeze roller and then drying is conducted.

The developer for use in the simple development is an aqueous solution having pH of from 2 to 11. An aqueous solution containing water as the main component (containing 60% by weight or more of water) is preferred. In particular, an aqueous solution containing a surfactant (for example, an anionic, nonionic, cationic or amphoteric surfactant) or an aqueous solution containing a water-soluble polymer compound is preferred. An aqueous solution containing both the surfactant and the water-soluble polymer compound is also preferred. The pH of the developer is preferably from 5 to 10.7, more preferably from 6 to 10.5, and most preferably from 7.5 to 10.3.

The anionic surfactant for use in the developer for the simple development is not particularly limited and includes, for example, fatty acid salts, abietic acid salts, hydroxyalkanesulfonic acid salts, alkanesulfonic acid salts, dialkylsulfosuccinic acid salts, straight-chain alkylbenzenesulfonic acid salts, branched alkylbenzenesulfonic acid salts, alkylnaphthalenesulfonic acid salts, alkyldiphenylether (di)sulfonic acid salts, alkylphenoxy polyoxyethylene propylalkylsulfonic acid salts, polyoxyethylene alkylsulfophenyl ether salts, N-methylalkyl-N-oleyltaurine sodium salt, N-alkylsulfosuccinic acid monoamide disodium salts, petroleum sulfonic acid salts, sulfated castor oil, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene-maleic anhydride copolymer, partially saponified products of olefin-maleic anhydride copolymer and naphthalene sulfonate formalin condensates. Of the compounds, alkylbenzenesulfonic acid salts, alkylnaphthalenesulfonic acid salts and alkyldiphenylether (di)sulfonic acid salts are particularly preferably used.

The cationic surfactant for use in the developer for the simple development is not particularly limited and conventionally known cationic surfactants can be used. Examples of the cationic surfactant include alkylamine salts, quaternary ammonium salts, alkylimidazolinium salts, polyoxyethylene alkyl amine salts and polyethylene polyamine derivatives.

The nonionic surfactant for use in the developer for the simple development is not particularly limited and includes, for example, polyethylene glycol type higher alcohol ethylene oxide adducts, alkylphenol ethylene oxide adducts, alkylnaphthol ethylene oxide adducts, phenol ethylene oxide adducts, naphthol ethylene oxide adducts, fatty acid ethylene oxide adducts, polyhydric alcohol fatty acid ester ethylene oxide adducts, higher alkylamine ethylene oxide adducts, fatty acid amide ethylene oxide adducts, ethylene oxide addacts of fat, polypropylene glycol ethylene oxide adducts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines. Of the compounds, those having an aromatic ring and an ethylene oxide chain are preferred and alkyl-substituted or unsubstituted phenol ethylene oxide adducts and alkyl-substituted or unsubstituted naphthol ethylene oxide adducts are more preferred.

The amphoteric surfactant for use in the developer for the simple development is not particularly limited and includes, for example, amine oxide type, for example, alkyldimethylamine oxide, betaine type, for example, alkyl betaine, and amino acid type, for example, sodium salt of alkylamino fatty acid. In particular, alkyldimethylamine oxide which may have a substituent, alkyl carboxy betaine which may have a substituent and alkyl sulfo betaine which may have a substituent are preferably used. Specific examples thereof include compounds represented by formula (2) described in Paragraph Nos. [0255] to [0278] of JP-A-2008-203359, compounds represented by formulae (I), (II) and (VI) described in Paragraph Nos. [0028] to [0052] of JP-A-2008-276166 and compounds described in Paragraph Nos. [0022] to [0029] of JP-A-2009-47927.

Two or more kinds of the surfactants may be used in combination. The content of the surfactant in the developer is preferably from 0.01 to 20% by weight, and more preferably from 0.1 to 10% by weight.

The water-soluble polymer compound for use in the developer for the simple development includes, for example, soybean polysaccharide, modified starch, gum arabic, dextrin, a cellulose derivative (for example, carboxymethyl cellulose, carboxyethyl cellulose or methyl cellulose) or a modified product thereof, pllulan, polyvinyl alcohol or a derivative thereof, polyvinyl pyrrolidone, polyacrylamide, an acrylamide copolymer, a vinyl methyl ether/maleic anhydride copolymer, a vinyl acetate/maleic anhydride copolymer, a styrene/maleic anhydride copolymer, polyvinylsulfonic acid or a salt thereof and polystyrenesulfonic acid or a salt thereof.

As the soybean polysaccharide, known soybean polysaccharide can be used. For example, as a commercial product, SOYAFIVE (trade name, produced by Fuji Oil Co., Ltd.) is available and various grade products can be used. The soybean polysaccharide preferably used is that having viscosity in a range from 10 to 100 mPa/sec in the 10% by weight aqueous solution thereof.

As the modified starch, known modified starch can be used. The modified starch can be prepared, for example, by a method wherein starch, for example, of corn, potato, tapioca, rice or wheat is decomposed, for example, with an acid or an enzyme to an extent that the number of glucose residue per molecule is from 5 to 30 and then oxypropylene is added thereto in an alkali.

Two or more kinds of the water-soluble polymer compounds may be used in combination. The content of the water-soluble polymer compound in the developer is preferably from 0.1 to 20% by weight, and more preferably from 0.5 to 10% by weight.

Into the developer for use in the simple development, a pH buffer agent may further be incorporated.

As the pH buffer agent according to the invention, any pH buffer agent exhibiting a pH buffer function at pH of from 2 to 11 can be preferably used. In the invention, a weak alkaline buffer agent is preferably used and includes, for example, (a) a carbonate ion and a hydrogen carbonate ion, (b) a borate ion, (c) a water-soluble amine compound and an ion of the water-soluble amine compound, and combinations thereof. Specifically, for example, (a) a combination of a carbonate ion and a hydrogen carbonate ion, (b) a borate ion, or (c) a combination of a water-soluble amine compound and an ion of the water-soluble amine compound exhibits a pH buffer function in the developer to prevent fluctuation of the pH even when the developer is used for a long period of time. As a result, for example, the deterioration of development property resulting from the fluctuation of pH and the occurrence of development scum are restrained. The combination of a carbonate ion and a hydrogen carbonate ion is particularly preferred.

In order for a carbonate ion and a hydrogen carbonate ion to be present in the developer, a carbonate and a hydrogen carbonate may be added to the developer or a carbonate ion and a hydrogen carbonate ion may be generated by adding a carbonate or a hydrogen carbonate to the developer and then adjusting the pH. The carbonate or hydrogen carbonate used is not particularly restricted and it is preferably an alkali metal salt thereof. Examples of the alkali metal include lithium, sodium and potassium and sodium is particularly preferable. The alkali metals may be used individually or in combination of two or more thereof.

When the combination of (a) a carbonate ion and a hydrogen carbonate ion is adopted as the pH buffer agent, the total amount of the carbonate ion and hydrogen carbonate ion is preferably from 0.05 to 5 mole/l, more preferably from 0.1 to 2 mole/l, particularly preferably from 0.2 to 1 mole/l, in the developer.

The developer for use in the simple development may contain an organic solvent. As the organic solvent to be contained, for example, an aliphatic hydrocarbon (e.g., hexane, heptane, Isopar E, Isopar H, Isopar G (produced by Esso Chemical Co., Ltd.), gasoline or kerosene), an aromatic hydrocarbon (e.g., toluene or xylene), a halogenated hydrocarbon (methylene dichloride, ethylene dichloride, trichlene or monochlorobenzene) or a polar solvent is exemplified. Examples of the polar solvent include an alcohol (e.g., methanol, ethanol, propanol, isopropanol, 1-butanol, 1-pentanol, 1-hexanol, 1-heptanol, 1-octanol, 2-octanol, 2-ethyl-1-hexanol, 1-nonanol, 1-decanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, propylene glycol monophenyl ether, methyl phenyl carbinol, n-amyl alcohol or methylamyl alcohol), a ketone (e.g., acetone, methyl ethyl ketone, ethyl butyl ketone, methyl isobutyl ketone or cyclohexanone), an ester (e.g., ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate or butyl levulinate) and others (e.g., triethyl phosphate, tricresyl phosphate, N-phenylethanolamine, N-phenyldiethanolamine, N-methyldiethanolamine, N-ethyldiethanolamine, 4-(2-hydroxyethyl)morpholine, N,N-dimethylacetamide or N-methylpyrrolidone). Two or more kinds of the organic solvents may be used in combination.

Further, when the organic solvent is insoluble in water, it may be employed by being solubilized in water using a surfactant or the like. In the case where the developer contains an organic solvent, the concentration of the organic solvent is desirably less than 40% by weight in view of safety and inflammability.

The developer may contain a preservative, a chelating agent, a defoaming agent, an organic acid, an inorganic acid, an inorganic salt or the like in addition to the components described above. Specifically, compounds described in Paragraph Nos. [0266] to [0270] of JP-A-2007-206217 are preferably used.

The developer described above can be used as a developer and a development replenisher for the exposed negative type lithographic printing plate precursor and it is preferably applied to an automatic development processor (hereinafter, also referred to as an automatic processor) described hereinafter. In the case of conducting the development processing using an automatic processor, the developer becomes fatigued in accordance with the processing amount, and hence the processing ability may be restored using a replenisher or a fresh developer.

The development processing using the developer having pH of from 2 to 14 according to the invention is preferably performed by an automatic processor equipped with a supplying means for the developer and a rubbing member. An automatic processor using a rotating brush roll as the rubbing member is particularly preferred. Further, the automatic processor is preferably provided with a means for removing the excess developer, for example, a squeeze roller or a drying means, for example, a hot air apparatus, subsequently to the development processing means.

Further, in the plate making process of preparing a lithographic printing plate from the lithographic printing plate precursor according to the invention, the lithographic printing plate precursor may be heated its entire surface before or during the exposure or between the exposure and the development, if desired. By the heating, the image-forming reaction in the image-recording layer is accelerated and advantages, for example, improvement in the sensitivity and printing durability and stabilization of the sensitivity are achieved. For the purpose of increasing the image strength and printing durability, it is also effective to perform entire after-heating or entire exposure of the image after the development. Ordinarily, the heating before the development is preferably performed under a mild condition of 150° C. or lower. When the temperature is too high, a problem may arise sometimes in that the unexposed area is also cured. On the other hand, the heating after the development can be performed using very strong conditions. Ordinarily, the heat treatment is carried out in a temperature range from 100 to 500° C. When the temperature is too low, a sufficient effect of strengthening the image may not be obtained, whereas when it is excessively high, problems of deterioration of the support and thermal decomposition of the image area may occur sometimes.

EXAMPLES

The present invention will be described in more detail with reference to the following examples, but the invention should not be construed as being limited thereto. With respect to the polymer compounds used in the examples, unless otherwise particularly defined, a molecular weight means a weight average molecular weight (Mw) and a ratio of repeating units is indicated in mole percent.

Examples 1 to 101 and Comparative Examples 1 to 4

Lithographic Printing Plate Precursor (1)
<Preparation of Support 1>

An aluminum plate of JIS A 1050 having a thickness of 0.30 mm and a width of 1,030 mm was continuously subjected to surface treatment according to various processes (a) to (f) shown below. After each process and water washing, removal of liquid was conducted with a nip roller.

(a) Etching treatment of the aluminum plate was conducted with an aqueous solution having sodium hydroxide concentration of 26% by weight, aluminum ion concentration of 6.5% by weight and temperature of 70° C. to dissolve the aluminum plate in an amount of 5 g/m$^2$. Subsequently, the plate was washed with water.

(b) Desmut treatment of the aluminum plate was conducted by spraying an aqueous 1% by weight nitric acid solution (containing 0.5% by weight of aluminum ion) having temperature of 30° C. Subsequently, the plate was washed with water.

(c) Electrochemical surface roughening treatment of the aluminum plate was continuously conducted by applying 60 Hz alternating current voltage. The electrolytic solution used was an aqueous 1% by weight nitric acid solution (containing 0.5% by weight of aluminum ion and 0.007% by weight of ammonium ion) and the solution temperature was 30° C. The electrochemical surface roughening treatment was conducted using a trapezoidal rectangular wave alternating current where time (TP) for reaching the current to its peak from zero was 2 msec and a duty ratio was 1:1 as an alternating current source, and using a carbon electrode as a counter electrode. A ferrite was used as an auxiliary anode. The current density was 25 A/dm$^2$ at the peak current, and the electric quantity was 250 C/dm$^2$ in terms of the total electric quantity during the aluminum plate functioning as an anode. To the auxiliary anode, 5% of the current flowing from the electric source was divided. Subsequently, the plate was washed with water.

(d) Etching treatment of the aluminum plate was conducted at 35° C. by spraying an aqueous solution having a sodium hydroxide concentration of 26% by weight and an aluminum ion concentration of 6.5% by weight to dissolve the aluminum plate in an amount of 0.2 g/m$^2$. Thus, the smut component mainly comprising aluminum hydroxide formed in the precedent process of electrochemical surface roughening treatment using alternating current was removed and an edge portion of the pit formed was dissolved to smoothen the edge portion. Subsequently, the plate was washed with water.

(e) Desmut treatment of the aluminum plate was conducted by spraying an aqueous 25% by weight sulfuric acid solution (containing 0.5% by weight of aluminum ion) having temperature of 60° C. Subsequently, the plate was washed with water by spraying.

(f) Anodizing treatment of the aluminum plate was conducted in an aqueous solution having sulfuric acid concentration of 170 g/liter (containing 0.5% by weight of aluminum ion)

at temperature of 33° C. and current density of 5 A/dm² for 50 seconds. Subsequently, the plate was washed with water. The amount of the anodic oxide film was 2.7 g/m².

The surface roughness (Ra) of Support 1 thus-obtained was 0.27 (measuring instrument: SURFCOM having a stylus with a tip diameter of 2 μm, produced by Tokyo Seimitsu Co. Ltd.).

<Surface Hydrophilizing Treatment>

Support 1 was then immersed in an aqueous solution of 40° C. containing 4 g/liter of polyvinylphosphonic acid (Mw=15,000) for 10 seconds, washed with tap water of 20° C. for 2 seconds and dried to prepare an aluminum support subjected to a hydrophilizing treatment.

<Formation of Image-recording Layer>

Coating solution (1) for image-recording layer shown below was prepared and coated on the aluminum support subjected to the treatments described above using a wire bar. The drying was performed at 115° C. for 34 seconds by a hot air drying machine. The coverage of the image-recording layer after drying was from 1.4 g/m².

| <Coating solution (1) for image-recording layer> | |
|---|---|
| Polymerizable compound (Compound A having structure shown below) | 1.00 g |
| Binder polymer (Binder A) | 0.50 g |
| Sensitizing dye having structure shown below | 0.08 g |
| Polymerization initiator having structure shown below | 0.15 g |
| Chain transfer agent having structure shown below | 0.14 g |
| N-Nitrosophenylhydroxylamine aluminum salt | 0.005 g |
| Dispersion of ε-phthalocyanine pigment [pigment: 15 parts by weight; dispersing agent (Polymer (1) shown below): 10 parts by weight; solvent (cyclohexanone/methoxypropyl acetate/ 1-methoxy-2-propanol = 15 parts by weight/20 parts by weight/40 parts by weight)] | 0.18 g |
| Fluorine-based nonionic surfactant (MEGAFAC F-780, produced by DIC Corp.) | 0.004 g |
| Methyl ethyl ketone | 12.0 g |
| Propylene glycol monomethyl ether | 12.0 g |

The structures of Polymerizable compound (Compound A), Binder polymer (Binder A), Polymer (1), Polymerization initiator, Sensitizing dye and Chain transfer agent are shown below.

Compound A (Mixture of Isomers Described Above)

Chain transfer agent

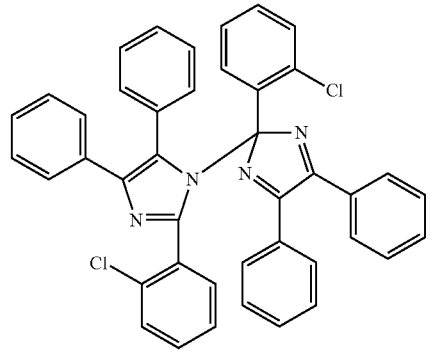

Polymerization initiator

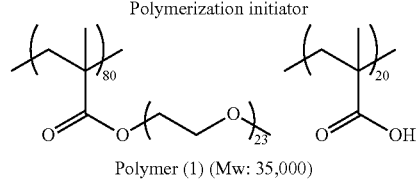

Polymer (1) (Mw: 35,000)

<Formation of Protective Layer>

Coating solution (1) for protective layer having the composition shown below was coated on the image-recording layer described above by a bar and dried at 120° C. for 60 seconds by an oven to form a protective layer having a dry coating amount of 0.15 g/m², thereby preparing lithographic printing plate precursors for Examples 1 to 100 and Comparative Examples 1 to 4, respectively.

Further, a lithographic printing plate precursor for Example 101 was prepared by forming a protective layer in the same manner as in the lithographic printing plate precur-

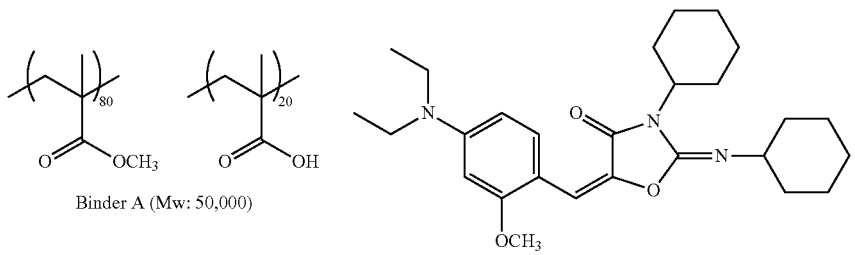

Binder A (Mw: 50,000)

Sensitizing dye:

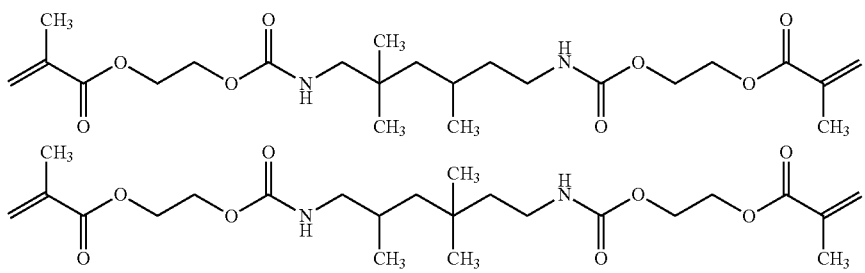

sor for Example 4 except for using Coating solution (2) for protective layer having the composition shown below in place of Coating solution (1) for protective layer.

<Coating solution (1) for protective layer>

| | |
|---|---|
| Dispersion of inorganic stratiform compound (1) shown below | 1.5 g |
| Hydrophilic polymer shown in Tables 1 to 4 (solid content) | 0.070 g |
| Aqueous 1% by weight solution of surfactant (EMALEX 710, produced by Nihon Emulsion Co., Ltd.) | 0.86 g |
| Ion-exchanged water | 6.54 g |

(Preparation of Dispersion of Inorganic Stratiform Compound (1))

To 193.6 g of ion-exchanged water was added 6.4 g of synthetic mica (SOMASIF ME-100, produced by CO-OP Chemical Co., Ltd.) and the mixture was dispersed using a homogenizer until an average particle size (according to a laser scattering method) became 3 μm to prepare Dispersion of inorganic stratiform compound (1). The aspect ratio of the inorganic particle thus-dispersed was 100 or more.

<Coating solution (2) for protective layer>

| | |
|---|---|
| Hydrophilic polymer 4 (solid content) | 0.035 g |
| Aqueous 1% by weight solution of surfactant (EMALEX 710, produced by Nihon Emulsion Co., Ltd.) | 0.86 g |
| Ion-exchanged water | 8.00 g |

The structures of the hydrophilic polymers used in Comparative Examples 1 to 3 are shown below.

Hydrophilic Polymers Used in Comparative Examples

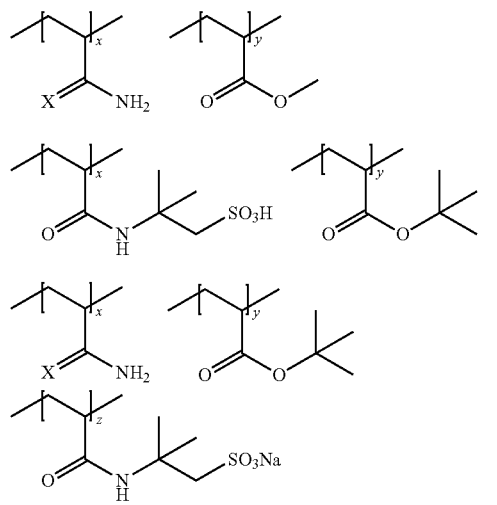

TABLE 5

| | Hydrophilic Polymer for Comparison | | | | |
|---|---|---|---|---|---|
| Comparative Example | Number of Hydrophilic Polymer | Composition Ratio (% by mole) | | | Mw |
| | | x | y | z | |
| Comparative Example 1 | 101 | 75 | 25 | — | 20,000 |
| Comparative Example 2 | 102 | 80 | 20 | — | 20,000 |
| Comparative Example 3 | 103 | 55 | 25 | 20 | 20,000 |

In Comparative Example 4, polyvinyl alcohol (CSK-50, sulfonic acid-modified, saponification degree: 99% by mole or more, polymerization degree: 300, produced by Nippon Synthetic Chemical Industry Co., Ltd.) was used as the hydrophilic polymer.

<Developer composition>

| | |
|---|---|
| Sodium carbonate | 130 g |
| Sodium hydrogen carbonate | 70 g |
| NEWCOL B13 (produced by Nippon Nyukazai Co., Ltd.) | 500 g |
| Gum arabic (water-soluble polymer, Mw = 200,000) | 250 g |
| Hydroxyalkylated starch (PENON JE66, produced by Nippon Starch Chemical Co., Ltd.) | 700 g |
| Ammonium primary phosphate | 20 g |
| 2-Bromo-2-nitropropane-1,3-diol | 0.1 g |
| 2-Methyl-4-isothiazoline-3-one | 0.1 g |
| Water | 9139.8 g |

(pH of developer = 9.8)

<Evaluation of Lithographic Printing Plate Precursor>
(1) Plate Making

Each of the lithographic printing plate precursors prepared was subjected to image exposure by Violet semiconductor laser platesetter Vx9600 (having InGaN semiconductor laser (emission wavelength: 405 nm±10 nm/output: 30 mW)) produced by FUJIFILM Electronic Imaging Ltd. (FFEI). The image drawing was performed at resolution of 2,438 dpi using an FM screen (TAFFETA 20, produced by FUJIFILM Corp.) in a plate surface exposure amount of 0.05 mJ/cm² so that the image has a halftone dot area ratio of 20% and 50%.

Then, the exposed lithographic printing plate precursor was pre-heated at 100° C. for 30 seconds and then subjected to development processing in an automatic development processor using the developer described above to prepare a lithographic printing plate. The automatic development processor was equipped with one brush roller having an outer diameter of 50 mm and being implanted with fiber of polybutylene terephthalate (bristle diameter: 200 μm, bristle length: 17 mm), and the brush roller was rotated at 200 rpm (peripheral velocity at the tip of brush: 0.52 m/sec) in the same direction as the transporting direction of the lithographic printing plate precursor. The temperature of the developer was 30° C. The transportation of the lithographic printing plate precursor was performed at transporting speed of 100 cm/min. After the development processing, drying was performed in the drying unit. The temperature of drying was 80° C.

(2) Evaluation of Ink Receptivity
i) Initial Ink Receptivity

The lithographic printing plate prepared as above was mounted on a plate cylinder of a printing machine (LITHRONE 26, produced by Komori Corp.). Using dampening water (ECOLITY-2 (produced by FUJIFILM Corp.)/ tap water=2/98 (volume ratio)) and SPACE COLOR FUSION-G (N) Black Ink (produced by DIC Graphics Corp.), printing was conducted on TOKUBISHI Art Paper (76.5 kg) at a printing speed of 10,000 sheets per hour.

A number of the printing papers required until ink density of the image area on the printing paper exhibited good ink receptivity was measured as the initial ink receptivity. The results obtained are shown in Tables 6 to 8.

ii) Ink Receptivity of Special Color Ink (Immediately After Preparation and After Preservation)

The printing was conducted in the same manner as in the evaluation of initial ink receptivity except for using special color ink (EPPLE PANTONE BLAU 072C, produced by Epple AG) as the ink. The 10,000$^{th}$ printing paper was sampled and an ink density of the 20% halftone dot of FM screen was measured using a Gretag densitometer. Based on the measured value, the ink receptivity was evaluated according to the criterion shown below. The results obtained are shown in Tables 6 to 8.

A: Ink density from 1.8 to 1.9. The ink density did not decrease at all and good ink receptivity was exhibited.
B: Ink density from 1.5 to 1.7. The ink density somewhat decreased but it was at an acceptable level.
C: Ink density from 1.0 to 1.4. The ink density clearly decreased and it was an unacceptable level.
D: Ink density of 0.9 or less. The ink density severely decreased and the ink receptivity was bad.

The result of the ink receptivity after preservation was obtained by preserving the lithographic printing plate precursor at 60° C. for 4 days and then conducting the evaluation described above.

(3) Evaluation of Printing Durability

A lithographic printing plate for use in the evaluation of printing durability was prepared by plate making in the same manner as above, except for using 50% halftone square dot as an exposure pattern at the plate making. Using the lithographic printing plate prepared, printing was conducted under the same conditions as in the evaluation of initial ink receptivity. The printing was continued while repeating an operation of wiping off ink from the surface of lithographic printing plate with multi-cleaner (produced by FUJIFILM Corp.) after printing every 10,000 sheets and when the printing with sufficient ink density could not be conducted, the printing was regarded as finished. Taking a number of printed materials obtained until the finish of printing for the lithographic printing plate of Comparative Example 1 as 100, the numbers of printed materials obtained until the finish of printing for other lithographic printing plates are relatively evaluated. As the numerical value is larger, the printing durability is more excellent.

TABLE 6

Examples 1 to 37

| Example | Number of Hydrophilic Polymer | Initial Ink Receptivity (sheets) | Ink Receptivity of Special Color Ink Immediately after Preparation | Ink Receptivity of Special Color Ink After Preservation | Printing Durability |
|---|---|---|---|---|---|
| Example 1 | 1 | 17 | B | B | 100 |
| Example 2 | 2 | 17 | B | B | 100 |
| Example 3 | 3 | 13 | A | B | 100 |
| Example 4 | 4 | 13 | A | B | 100 |
| Example 5 | 5 | 13 | A | B | 100 |
| Example 6 | 6 | 17 | B | B | 100 |
| Example 7 | 7 | 17 | B | B | 100 |
| Example 8 | 8 | 17 | B | B | 100 |
| Example 9 | 9 | 17 | B | B | 100 |
| Example 10 | 10 | 17 | B | B | 100 |
| Example 11 | 11 | 17 | B | B | 100 |
| Example 12 | 12 | 17 | B | B | 100 |
| Example 13 | 13 | 17 | B | B | 100 |
| Example 14 | 14 | 17 | B | B | 100 |
| Example 15 | 15 | 17 | B | B | 100 |
| Example 16 | 16 | 17 | B | B | 100 |
| Example 17 | 17 | 17 | B | B | 100 |
| Example 18 | 18 | 17 | B | B | 100 |
| Example 19 | 19 | 17 | B | B | 100 |
| Example 20 | 20 | 17 | B | B | 100 |
| Example 21 | 21 | 17 | B | B | 100 |
| Example 22 | 22 | 17 | B | B | 100 |
| Example 23 | 23 | 17 | B | B | 100 |
| Example 24 | 24 | 17 | B | B | 100 |
| Example 25 | 25 | 17 | B | B | 100 |
| Example 26 | 26 | 17 | B | B | 100 |
| Example 27 | 27 | 17 | B | B | 100 |
| Example 28 | 28 | 17 | B | B | 100 |
| Example 29 | 29 | 17 | B | B | 100 |
| Example 30 | 30 | 17 | B | B | 100 |
| Example 31 | 31 | 17 | B | B | 100 |
| Example 32 | 32 | 17 | B | B | 100 |
| Example 33 | 33 | 17 | B | B | 100 |
| Example 34 | 34 | 17 | B | B | 100 |
| Example 35 | 35 | 17 | B | B | 100 |
| Example 36 | 36 | 17 | B | B | 100 |
| Example 37 | 37 | 17 | B | B | 100 |

TABLE 7

Examples 38 to 74

| Example | Number of Hydrophilic Polymer | Initial Ink Receptivity (sheets) | Ink Receptivity of Special Color Ink Immediately after Preparation | Ink Receptivity of Special Color Ink After Preservation | Printing Durability |
|---|---|---|---|---|---|
| Example 38 | 38 | 17 | B | B | 100 |
| Example 39 | 39 | 17 | B | B | 100 |
| Example 40 | 40 | 17 | B | B | 100 |
| Example 41 | 41 | 17 | B | B | 100 |
| Example 42 | 42 | 17 | B | B | 100 |
| Example 43 | 43 | 17 | B | B | 100 |
| Example 44 | 44 | 17 | B | B | 100 |
| Example 45 | 45 | 17 | B | B | 100 |
| Example 46 | 46 | 17 | B | B | 100 |
| Example 47 | 47 | 17 | B | B | 100 |
| Example 48 | 48 | 17 | B | B | 100 |
| Example 49 | 49 | 13 | A | B | 100 |
| Example 50 | 50 | 17 | B | B | 100 |
| Example 51 | 51 | 17 | B | B | 100 |
| Example 52 | 52 | 17 | B | B | 100 |
| Example 53 | 53 | 13 | A | B | 100 |
| Example 54 | 54 | 17 | B | B | 100 |
| Example 55 | 55 | 17 | B | B | 100 |
| Example 56 | 56 | 17 | B | B | 100 |
| Example 57 | 57 | 17 | B | B | 100 |
| Example 58 | 58 | 17 | B | B | 100 |
| Example 59 | 59 | 17 | B | B | 100 |
| Example 60 | 60 | 17 | B | B | 100 |
| Example 61 | 61 | 13 | A | B | 100 |
| Example 62 | 62 | 17 | B | B | 100 |
| Example 63 | 63 | 17 | B | B | 100 |
| Example 64 | 64 | 17 | B | B | 100 |
| Example 65 | 65 | 13 | A | B | 100 |
| Example 66 | 66 | 17 | B | B | 100 |
| Example 67 | 67 | 17 | B | B | 100 |
| Example 68 | 68 | 17 | B | B | 100 |
| Example 69 | 69 | 13 | A | B | 100 |
| Example 70 | 70 | 17 | B | B | 100 |
| Example 71 | 71 | 13 | A | A | 100 |
| Example 72 | 72 | 13 | A | A | 100 |
| Example 73 | 73 | 13 | A | A | 100 |
| Example 74 | 74 | 17 | B | B | 100 |

TABLE 8

Examples 75 to 101 and Comparative Examples 1 to 4

| Example | Number of Hydrophilic Polymer | Initial Ink Receptivity (sheets) | Ink Receptivity of Special Color Ink Immediately after Preparation | Ink Receptivity of Special Color Ink After Preservation | Printing Durability |
|---|---|---|---|---|---|
| Example 75 | 75 | 17 | B | B | 100 |
| Example 76 | 76 | 17 | B | B | 100 |
| Example 77 | 77 | 17 | B | B | 100 |
| Example 78 | 78 | 17 | B | B | 100 |
| Example 79 | 79 | 13 | A | A | 100 |
| Example 80 | 80 | 13 | A | A | 100 |
| Example 81 | 81 | 13 | A | B | 100 |
| Example 82 | 82 | 13 | A | B | 100 |
| Example 83 | 83 | 13 | A | B | 100 |
| Example 84 | 84 | 13 | A | B | 100 |
| Example 85 | 85 | 13 | A | B | 100 |
| Example 86 | 86 | 17 | B | B | 100 |
| Example 87 | 87 | 17 | B | B | 100 |
| Example 88 | 88 | 13 | A | A | 100 |

TABLE 8-continued

Examples 75 to 101 and Comparative Examples 1 to 4

| Example | Number of Hydrophilic Polymer | Initial Ink Receptivity (sheets) | Ink Receptivity of Special Color Ink | | Printing Durability |
|---|---|---|---|---|---|
| | | | Immediately after Preparation | After Preservation | |
| Example 89 | 89 | 13 | A | A | 100 |
| Example 90 | 90 | 13 | A | A | 100 |
| Example 91 | 91 | 13 | A | B | 100 |
| Example 92 | 92 | 13 | A | B | 100 |
| Example 93 | 93 | 13 | A | B | 100 |
| Example 94 | 94 | 13 | A | A | 100 |
| Example 95 | 95 | 13 | A | A | 100 |
| Example 96 | 96 | 13 | A | A | 100 |
| Example 97 | 97 | 13 | A | A | 100 |
| Example 98 | 98 | 13 | A | A | 100 |
| Example 99 | 99 | 13 | A | B | 100 |
| Example 100 | 100 | 13 | A | B | 100 |
| Example 101 | 4 | 17 | B | B | 90 |
| Comparative Example 1 | 101 | 17 | B | D | 100 |
| Comparative Example 2 | 102 | 17 | B | C | 100 |
| Comparative Example 3 | 103 | 17 | B | D | 80 |
| Comparative Example 4 | CSK-50 | 17 | C | D | 80 |

From the results shown above, it can be seen that the ink receptivity is excellent by the incorporation of (E) the hydrophilic polymer containing repeating units having the specific structures into the protective layer. In particular, the effect is large on the deterioration of ink receptivity of special color ink after preservation of the lithographic printing plate precursor.

Examples 102 to 202 and Comparative Examples 5 to 8

Lithographic Printing Plate Precursor (2)
<Formation of Undercoat Layer>
Coating solution (1) for undercoat layer shown below was coated on Support 1 described above by a wire bar and dried at 90° C. for 30 seconds. The coating amount of the undercoat layer was 10 mg/m².

| <Coating solution (1) for undercoat layer> | |
|---|---|
| Polymer compound A having structure shown below (Mw: 10,000) | 0.05 g |
| Methanol | 27 g |
| Ion-exchanged water | 3 g |

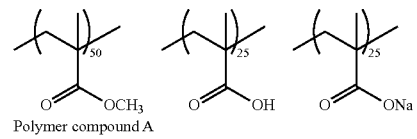
Polymer compound A

<Formation of Image-recording Layer>
Coating solution (2) for image-recording layer shown below was prepared and coated on the support using a wire bar to from an image-recording layer. The drying was performed at 115° C. for 34 seconds by a hot air drying machine. The coverage of the image-recording layer after drying was 1.4 g/m².

| <Coating solution (2) for image-recording layer> | |
|---|---|
| Infrared absorbing agent (1) having structure shown below | 0.10 g |
| Polymerization initiator (1) having structure shown below | 0.30 g |
| Pentaerythritol triacrylate hexamethylene diisocyanate urethane prepolymer (UA-306H, produced by Kyoeisha Chemical Co., Ltd.) | 1.33 g |
| Binder polymer (2) having structure shown below | 1.35 g |
| Ethyl violet | 0.04 g |
| Fluorine-based surfactant (MEGAFAC F-780-F, 30% by weight methyl isobutyl ketone (MIBK) solution, produced by DIC Corp.) | 0.025 g |
| Methyl ethyl ketone | 18.4 g |
| Methanol | 9.83 g |
| 1-Methoxy-2-propanol | 18.4 g |

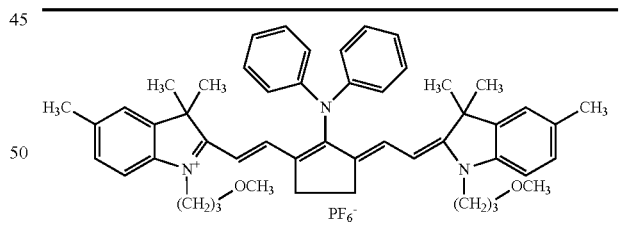
Infrared absorbing agent (1)

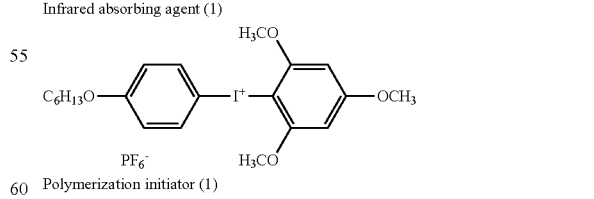
Polymerization initiator (1)

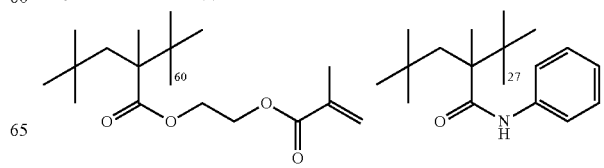

<Coating solution (2) for image-recording layer>

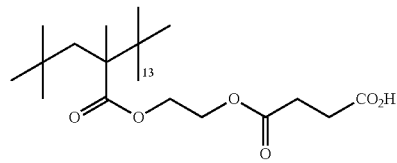 [SMILES: CC(C)(C)CC(C)(C(=O)OCCOC(=O)CCC(=O)O)C(C)(C)C]

Binder polymer (2) (Mw: 80,000)

<Formation of Protective Layer>

Coating solution (1) for protective layer described above was coated on the image-recording layer described above by a bar and dried at 120° C. for 60 seconds by an oven to form a protective layer having a dry coating amount of 0.15 g/m$^2$, thereby preparing lithographic printing plate precursors for Examples 102 to 202 and Comparative Examples 5 to 8, respectively.

Further, a lithographic printing plate precursor for Example 202 was prepared by forming a protective layer in the same manner as in the lithographic printing plate precursor for Example 105 except for using Coating solution (2) for protective layer described above in place of Coating solution (1) for protective layer.

The hydrophilic polymers used in Comparative Examples 5 to 8 are same as those used in Comparative Examples 1 to 4, respectively.

Examples 203 to 205

Lithographic Printing Plate Precursor (3)

Lithographic printing plate precursors (3) were prepared in the same manner as in Examples 105, 173 and 174 of Lithographic printing plate precursors (2) except that the coating solution for image-recording layer was changed to Coating solution (3) for image-recording layer shown below and that after coating by a bar, the drying was conducted at 70° C. for 60 seconds by an oven to form an image-recording layer having a dry coating amount of 0.6 g/m$^2$, respectively.

| <Coating solution (3) for image-recording layer> | |
|---|---|
| Polymer (B) according to synthesis shown below | 0.9 g |
| HYBRIDUR 580 (produced by Air Products and Chemicals, Inc.) | 1.2 g |
| Monomer having ethylenically unsaturated group (SR-399, produced by Sartomer Co., Inc.) | 1.35 g |
| NK ESTER A-DPH (produced by Kowa American Corp.) | 1.35 g |
| CD 9053 (produced by Sartomer Co., Inc.) | 0.25 g |
| Polymerization initiator (2) having structure shown below | 0.0162 g |
| FluorN 2900 (produced by Cytonix Corp.) | 0.05 g |
| Pigment 1 | 0.4 g |
| Infrared absorbing agent (3) | 0.030 g |
| 1-Methoxy-2-propanol | 50.0 g |
| γ-Butyrolactone | 15.0 g |
| Methyl ethyl ketone | 60.0 g |
| Water | 15.0 g |

The compounds indicated using their trade names or the like in the composition above are shown below.
HYBRIDUR 580: Polyurethane acryl hybrid dispersion
SR-399: Dipentaerythritol pentaacrylate
NK ESTER A-DPH: Dipentaerythritol hexaacrylate
CD 9053: Trifunctional acid ester
FluorN 2900: Perfluoropolyether polyethylene glycol (550) block polymer Pigment 1: Dispersion of 23% by weight of solid content in 1-methoxy-2-propanol wherein the solid content was composed of 7.7% of polyvinyl acetal derived from polyvinyl acetal obtained by acetalification of polyvinyl alcohol with acetaldehyde, butylaldehyde and 4-formylbenzoic acid, 76.9% of Irgalith Blue GLVO (Cu-phthalocyanine C. I. Pigment Blue 15:4) and 15.4% of Disperbyk 167 dispersant (produced by Byk Chemie)

Infrared absorbing agent (3):
2-[2-[3-[2-(1,3-Dihydro-1,3,3-trimethyl-2H-indol-2-ylidene)-ethylydene]-2-(1-phenyl-1H-tetrazol-5-ylsulfanyl-1-cyclohexen-1-yl)-ethenyl]-1,3,3-trimethyl-3H-indolium chloride (produced by FEW Chemicals GmbH)

Structural formula of Polymerization initiatior (2)

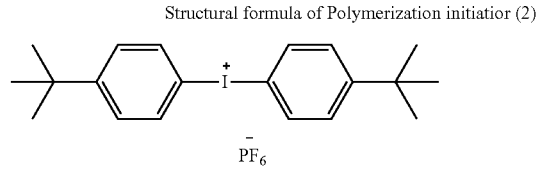

(Synthesis of Polymer (B))

A stirrer, a thermometer, a dropping funnel, a nitrogen inlet tube and a reflux condenser were attached to a 1,000 ml three-neck flask and while carrying out deoxygenation by introduction of nitrogen gas, 1.6 g of 2,2'-azobisisobutyronitrile, 20 g of methyl methacrylate, 24 g of acrylonitrile, 20 g of N-vinylcarbazole, 16 g of metacrylic acid and 320 g of N,N'-dimethylacetamide were charged therein and heated at 60° C. for about 16 hours.

To the reaction mixture was slowly added an aqueous solution containing 5.2 g of potassium hydroxide in 40 g of water and the reaction mixture became highly viscous liquid. After stirring for 10 minutes, 13.3 g of allyl bromide was added to the reaction mixture, followed by heating at 55° C. for 3 hours. To the reaction mixture was added 12 g of concentrated hydrochloric acid diluted with 40 g of N,N'-dimethylacetamide, followed by further stirring for 3 hours. The reaction solution was slowly added to a mixture of 12 liters of ice water and 20 g of concentrated hydrochloric acid, followed by stirring for a while. The precipitates thus-deposited were collected by filtration and washed first with 2,000 ml of 2-propanol and then with 2,000 ml of water to obtain white powder. The powder was air-dried overnight and then dried at 50° C. for 3 hours to obtain 80 g of Polymer (B).

<Evaluation of Lithographic Printing Plate Precursor>
(1) Plate Making

Each of the lithographic printing plate precursors prepared was transported from a setting unit to TRENDSETTER 3244 (produced by Creo Co.) by an autoloader and exposed a solid image and 20% halftone dot chart and 5% halftone dot chart of 20 μm dot FM screen at resolution of 2,400 dpi, an output of 7 W, a rotational number of an external drum of 150 rpm and an energy on the plate surface of 110 mJ/cm$^2$. After the exposure, without conducting heat treatment and water washing treatment, the exposed lithographic printing plate precursor was subjected to development processing using an automatic developing machine (LP-1310HII, produced by FUJI FILM Corp.) at a transporting speed (line speed) of 2 m/min and at development temperature of 30° C. The developer used was a solution prepared by diluting DH-N (produced by FUJIFILM Corp.) with water in a ratio of 1:4 (pH=12.1). The development replenisher used was a solution prepared by diluting FCT-421 (produced by FUJIFILM Corp.) with water in a ratio of 1:1.4.

(2) Evaluation of Initial Ink Receptivity and Ink Receptivity of Special Color Ink (Immediately After Preparation and After Preservation)

The evaluation was conducted in the same manner as in Lithographic printing plate precursor (1) described above.

The results obtained are shown in Tables 9 to 11.

(3) Evaluation of Printing Durability

The lithographic printing plate after the development processing was mounted on a plate cylinder of a printing machine (LITHRONE 26, produced by Komori Corp.) and the printing was conducted under the same conditions as in the evaluation of initial ink receptivity. While cleaning the surface of lithographic printing plate with multi-cleaner E (produced by FUJIFILM Corp.) after printing every about 5,000 sheets and due to decrease in the ink density of the image area when density of 5% halftone dot of 20 μm dot FM screen was decreased by 0.5% from that at the initiation of printing, the printing was regarded as finished. A number of printed materials obtained until the finish of printing was considered as a number of printing durability. Taking a number of printing durability of the lithographic printing plate of Comparative Example 5 as 100, the printing durability of other lithographic printing plates are relatively evaluated. As the numerical value is larger, the printing durability is higher.

TABLE 9

Examples 102 to 139

| | | | Ink Receptivity | | |
| --- | --- | --- | --- | --- | --- |
| | | | | Ink Receptivity of Special Color Ink | |
| Example | Number of Hydrophilic Polymer | Initial Ink Receptivity (sheets) | Immediately after Preparation | After Preservation | Printing Durability |
| Example 102 | 1 | 15 | B | B | 100 |
| Example 103 | 2 | 15 | B | B | 100 |
| Example 104 | 3 | 11 | A | B | 100 |
| Example 105 | 4 | 11 | A | B | 100 |
| Example 106 | 5 | 11 | A | B | 100 |
| Example 107 | 6 | 15 | B | B | 100 |
| Example 108 | 7 | 15 | B | B | 100 |
| Example 109 | 8 | 15 | B | B | 100 |
| Example 110 | 9 | 15 | B | B | 100 |
| Example 111 | 10 | 15 | B | B | 100 |
| Example 112 | 11 | 15 | B | B | 100 |
| Example 113 | 12 | 15 | B | B | 100 |
| Example 114 | 13 | 15 | B | B | 100 |
| Example 115 | 14 | 15 | B | B | 100 |
| Example 116 | 15 | 15 | B | B | 100 |
| Example 117 | 16 | 15 | B | B | 100 |
| Example 118 | 17 | 15 | B | B | 100 |
| Example 119 | 18 | 15 | B | B | 100 |
| Example 120 | 19 | 15 | B | B | 100 |
| Example 121 | 20 | 15 | B | B | 100 |
| Example 122 | 21 | 15 | B | B | 100 |
| Example 123 | 22 | 15 | B | B | 100 |
| Example 124 | 23 | 15 | B | B | 100 |
| Example 125 | 24 | 15 | B | B | 100 |
| Example 126 | 25 | 15 | B | B | 100 |
| Example 127 | 26 | 15 | B | B | 100 |
| Example 128 | 27 | 15 | B | B | 100 |
| Example 129 | 28 | 15 | B | B | 100 |
| Example 130 | 29 | 15 | B | B | 100 |
| Example 131 | 30 | 15 | B | B | 100 |
| Example 132 | 31 | 15 | B | B | 100 |
| Example 133 | 32 | 15 | B | B | 100 |
| Example 134 | 33 | 15 | B | B | 100 |
| Example 135 | 34 | 15 | B | B | 100 |
| Example 136 | 35 | 15 | B | B | 100 |
| Example 137 | 36 | 15 | B | B | 100 |
| Example 138 | 37 | 15 | B | B | 100 |
| Example 139 | 38 | 15 | B | B | 100 |

TABLE 10

Examples 140 to 176

| Example | Number of Hydrophilic Polymer | Initial Ink Receptivity (sheets) | Ink Receptivity of Special Color Ink Immediately after Preparation | Ink Receptivity of Special Color Ink After Preservation | Printing Durability |
|---|---|---|---|---|---|
| Example 140 | 39 | 15 | B | B | 100 |
| Example 141 | 40 | 15 | B | B | 100 |
| Example 142 | 41 | 15 | B | B | 100 |
| Example 143 | 42 | 15 | B | B | 100 |
| Example 144 | 43 | 15 | B | B | 100 |
| Example 145 | 44 | 15 | B | B | 100 |
| Example 146 | 45 | 15 | B | B | 100 |
| Example 147 | 46 | 15 | B | B | 100 |
| Example 148 | 47 | 15 | B | B | 100 |
| Example 149 | 48 | 15 | B | B | 100 |
| Example 150 | 49 | 11 | A | B | 100 |
| Example 151 | 50 | 15 | B | B | 100 |
| Example 152 | 51 | 15 | B | B | 100 |
| Example 153 | 52 | 15 | B | B | 100 |
| Example 154 | 53 | 11 | A | B | 100 |
| Example 155 | 54 | 15 | B | B | 100 |
| Example 156 | 55 | 15 | B | B | 100 |
| Example 157 | 56 | 15 | B | B | 100 |
| Example 158 | 57 | 15 | B | B | 100 |
| Example 159 | 58 | 15 | B | B | 100 |
| Example 160 | 59 | 15 | B | B | 100 |
| Example 161 | 60 | 15 | B | B | 100 |
| Example 162 | 61 | 11 | A | B | 100 |
| Example 163 | 62 | 15 | B | B | 100 |
| Example 164 | 63 | 15 | B | B | 100 |
| Example 165 | 64 | 15 | B | B | 100 |
| Example 166 | 65 | 11 | A | B | 100 |
| Example 167 | 66 | 15 | B | B | 100 |
| Example 168 | 67 | 15 | B | B | 100 |
| Example 169 | 68 | 15 | B | B | 100 |
| Example 170 | 69 | 11 | A | B | 100 |
| Example 171 | 70 | 15 | B | B | 100 |
| Example 172 | 71 | 11 | A | A | 100 |
| Example 173 | 72 | 11 | A | A | 100 |
| Example 174 | 73 | 11 | A | A | 100 |
| Example 175 | 74 | 15 | B | B | 100 |
| Example 176 | 75 | 15 | B | B | 100 |

TABLE 6

Examples 177 to 205 and Comparative Examples 5 to 8

| Example | Number of Hydrophilic Polymer | Initial Ink Receptivity (sheets) | Ink Receptivity of Special Color Ink Immediately after Preparation | Ink Receptivity of Special Color Ink After Preservation | Printing Durability |
|---|---|---|---|---|---|
| Example 177 | 76 | 15 | B | B | 100 |
| Example 178 | 77 | 15 | B | B | 100 |
| Example 179 | 78 | 15 | B | B | 100 |
| Example 180 | 79 | 11 | A | A | 100 |
| Example 181 | 80 | 11 | A | A | 100 |
| Example 182 | 81 | 11 | A | B | 100 |
| Example 183 | 82 | 11 | A | B | 100 |
| Example 184 | 83 | 11 | A | B | 100 |
| Example 185 | 84 | 11 | A | B | 100 |
| Example 186 | 85 | 11 | A | B | 100 |
| Example 187 | 86 | 15 | B | B | 100 |
| Example 188 | 87 | 15 | B | B | 100 |
| Example 189 | 88 | 11 | A | A | 100 |
| Example 190 | 89 | 11 | A | A | 100 |

TABLE 6-continued

Examples 177 to 205 and Comparative Examples 5 to 8

| Example | Number of Hydrophilic Polymer | Initial Ink Receptivity (sheets) | Ink Receptivity of Special Color Ink | | Printing Durability |
|---|---|---|---|---|---|
| | | | Immediately after Preparation | After Preservation | |
| Example 191 | 90 | 11 | A | A | 100 |
| Example 192 | 91 | 11 | A | B | 100 |
| Example 193 | 92 | 11 | A | B | 100 |
| Example 194 | 93 | 11 | A | B | 100 |
| Example 195 | 94 | 11 | A | A | 100 |
| Example 196 | 95 | 11 | A | A | 100 |
| Example 197 | 96 | 11 | A | A | 100 |
| Example 198 | 97 | 11 | A | A | 100 |
| Example 199 | 98 | 11 | A | A | 100 |
| Example 200 | 99 | 11 | A | B | 100 |
| Example 201 | 100 | 11 | A | B | 100 |
| Example 202 | 4 | 15 | B | B | 90 |
| Example 203 | 4 | 11 | A | B | 100 |
| Example 204 | 72 | 11 | A | A | 100 |
| Example 205 | 73 | 11 | A | A | 100 |
| Comparative Example 5 | 101 | 15 | B | D | 100 |
| Comparative Example 6 | 102 | 15 | B | C | 100 |
| Comparative Example 7 | 103 | 15 | B | D | 80 |
| Comparative Example 8 | CSK-50 | 15 | C | D | 80 |

What is claimed is:

1. A lithographic printing plate precursor comprising, in the following order:

a support;

an image-recording layer which is capable of forming an image by removing an unexposed area by an automatic development processor in the presence of a developer having pH of from 2 to 14 after exposure and contains (A) a sensitizing dye, (B) a polymerization initiator, (C) a polymerizable compound and (D) an organic polymer having a carboxylic acid or salt thereof; and a protective layer, wherein the protective layer contains (E) a hydrophilic polymer which has a repeating unit represented by the following formula (1) and a repeating unit represented by the following formula (2) and a sum of the repeating unit represented by the formula (1) and the repeating unit represented by the formula (2) is at least 95% by mole based on total repeating units constituting the polymer:

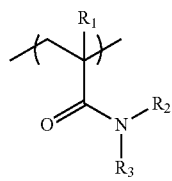

Formula (1)

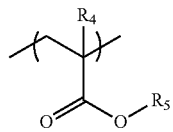

Formula (2)

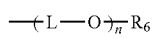

Formula (3)

wherein, in the formulae (1) and (2), $R_1$ and $R_4$ each independently represents a hydrogen atom or a methyl group, $R_2$ and $R_3$, which may be the same or different, each represents a hydrogen atom, a methyl group or an ethyl group, and $R_5$ represents an alkyl group having from 2 to 10 carbon atoms or a substituent represented by the following formula (3), and in the formula (3), L represents an alkylene group having from 2 to 6 carbon atoms, $R_6$ represents an alkyl group having from 4 to 8 carbon atoms, and n is an average addition molar number of polyether and represents a number of from 2 to 4, wherein the polymer (E) further has a repeating unit represented by the following formula (4) in an amount of from 0.3 to 5.0% by mole based on total repeating units constituting the polymer:

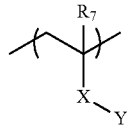

Formula (4)

-continued

Structural Group (5)

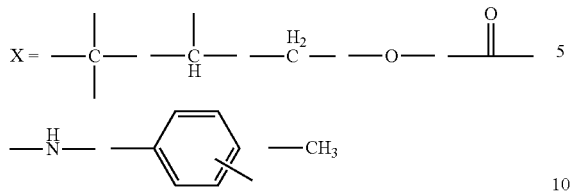

wherein, in the formula (4), $R^7$ represents a hydrogen atom or a methyl group, X represents a single bond, a divalent connecting chain selected from structures of Structural Group (5) or a divalent connecting chain formed by a combination of two or more structures of Structural Group (5), and Y represents at least one substituent selected from a carboxylic acid group, a carboxylate group, a sulfonic acid group, a sulfonate group, a phosphoric acid group, a phosphate group, a phosphonic acid group, a phosphonate group, a hydroxy group, a carbobetaine group, a sulfobetaine group and an ammonium group.

2. The lithographic printing plate precursor as claimed in claim 1, wherein Y in the formula (4) is at least one substituent selected from a sulfonic acid group, a sulfonate group, a carbobetaine group, a sulfobetaine group and an ammonium group.

3. A lithographic printing plate precursor comprising, in the following order:
   a support;
   an image-recording layer which is capable of forming an image by removing an unexposed area by an automatic development processor in the presence of a developer having pH of from 2 to 14 after exposure and contains (A) a sensitizing dye, (B) a polymerization initiator, (C) a polymerizable compound and (D) an organic polymer having a carboxylic acid or salt thereof; and
   a protective layer,
   wherein the protective layer contains (E) a hydrophilic polymer which has a repeating unit represented by the following formula (1) and a repeating unit represented by the following formula (2) and a sum of the repeating unit represented by the formula (1) and the repeating unit represented by the formula (2) is at least 95% by mole based on total repeating units constituting the polymer:

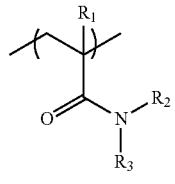

Formula (1)

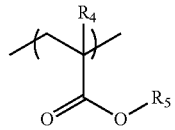

Formula (2)

wherein, in the formulae (1) and (2), $R_1$ and $R_4$ each independently represents a hydrogen atom or a methyl group, $R_2$ and $R_3$ in the repeating unit represented by the formula (1) are both hydrogen atoms and $R_5$ in the repeating unit represented by the formula (2) is an unsubstituted straight-chain, branched or cyclic alkyl group having from 2 to 8 carbon atoms.

4. The lithographic printing plate precursor as claimed in claim 1, wherein the protective layer contains (F) an inorganic stratiform compound.

5. The lithographic printing plate precursor as claimed in claim 1, wherein the sensitizing dye (A) is an infrared absorbing dye.

6. A method of preparing a lithographic printing plate comprising:
   exposing imagewise the lithographic printing plate precursor as claimed in claim 1 and removing an unexposed area of the image-recording layer of the exposed lithographic printing plate precursor by an automatic development processor in the presence of a developer having pH of from 2 to 14.

7. The lithographic printing plate precursor as claimed in claim 3, wherein the protective layer contains (F) an inorganic stratiform compound.

8. The lithographic printing plate precursor as claimed in claim 3, wherein the sensitizing dye (A) is an infrared absorbing dye.

9. A method of preparing a lithographic printing plate comprising:
   exposing imagewise the lithographic printing plate precursor as claimed in claim 3 and removing an unexposed area of the image-recording layer of the exposed lithographic printing plate precursor by an automatic development processor in the presence of a developer having pH of from 2 to 14.

* * * * *